United States Patent
Yamakaji et al.

(10) Patent No.: US 11,211,912 B2
(45) Date of Patent: Dec. 28, 2021

(54) NOISE FILTER

(71) Applicant: Mitsubishi Electric Corporation, Tokyo (JP)

(72) Inventors: Yusuke Yamakaji, Tokyo (JP); Ikuro Suga, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/979,860

(22) PCT Filed: May 18, 2018

(86) PCT No.: PCT/JP2018/019319
§ 371 (c)(1),
(2) Date: Sep. 11, 2020

(87) PCT Pub. No.: WO2019/220626
PCT Pub. Date: Nov. 21, 2019

(65) Prior Publication Data
US 2021/0058053 A1  Feb. 25, 2021

(51) Int. Cl.
*H03H 7/01* (2006.01)
*H03H 7/09* (2006.01)
*H03H 1/00* (2006.01)

(52) U.S. Cl.
CPC ........ *H03H 7/0115* (2013.01); *H03H 7/0153* (2013.01); *H03H 7/09* (2013.01); *H03H 1/0007* (2013.01)

(58) Field of Classification Search
CPC ................. H03H 7/427; H03H 7/0115; H03H 2001/0085; H03H 1/0007
USPC .......................................... 333/175, 185, 181
See application file for complete search history.

(56) References Cited

U.S. PATENT DOCUMENTS

| | | |
|---|---|---|
| 2011/0234337 A1 | 9/2011 | Saitou et al. |
| 2016/0086723 A1 | 3/2016 | Su et al. |
| 2016/0126919 A1 | 5/2016 | Tsubaki et al. |

(Continued)

FOREIGN PATENT DOCUMENTS

| | | |
|---|---|---|
| JP | 05-161268 A | 6/1993 |
| JP | 07-099136 A | 4/1995 |
| JP | 07-272934 A | 10/1995 |

(Continued)

OTHER PUBLICATIONS

European Search Report dated Apr. 22, 2021 in European Patent Application No. 18918912.9.

(Continued)

*Primary Examiner* — Rakesh B Patel
(74) *Attorney, Agent, or Firm* — Xsensus LLP

(57) ABSTRACT

A noise filter includes a first capacitor and a second capacitor which are two line-to-line capacitors. Currents flowing through the first capacitor and the second capacitor are in directions opposite to each other, and meanwhile, currents flowing through a first connection wire and a second connection wire are in the same direction and parallel to each other. Accordingly, magnetic coupling is caused between the connection wires and the line-to-line capacitors. Thus, the residual inductance of a line-to-line capacitor itself is reduced, whereby an attenuation characteristic for normal mode noise is further improved.

15 Claims, 20 Drawing Sheets

(56) References Cited

U.S. PATENT DOCUMENTS

2016/0276997 A1* 9/2016 Teramoto ............... H03H 7/427
2018/0115293 A1    4/2018 Yamamoto et al.

FOREIGN PATENT DOCUMENTS

| JP | 11-242063 A | 9/1999 |
| JP | 2000-315930 A | 11/2000 |
| JP | 2006-148519 A | 6/2006 |
| JP | 2011-044895 A | 3/2011 |
| JP | 2011-223557 A | 11/2011 |
| JP | 6113292 B2 | 4/2017 |
| WO | 2016/181835 A1 | 11/2016 |

OTHER PUBLICATIONS

International Search Report and Written Opinion dated Jun. 26, 2018 for PCT/JP2018/019319 filed on May 18, 2018, 10 pages including English Translation of the International Search Report.

* cited by examiner

NOISE FILTER

CROSS-REFERENCE TO RELATED APPLICATION

The present application is based on PCT filing PCT/JP2018/019319, filed May 18, 2018, the entire contents of which are incorporated herein by reference.

TECHNICAL FIELD

The present invention relates to a noise filter to be connected between, for example: an AC power supply and a converter circuit; or a battery and an inverter circuit.

BACKGROUND ART

Noise filters have a function of reducing high-frequency noise caused by control circuits or switching circuits of various electrical devices connected to the noise filters. The high-frequency noise can be divided into normal mode noise and common mode noise. The normal mode noise is a noise that is propagated from the origin of the noise through a signal line to a load. Meanwhile, the common mode noise is a noise that is propagated through the signal line to the ground side which includes a floating metal housing that does not necessarily have to be connected to earth ground.

As a method for reducing normal mode noise, a noise filter in which wires between two line-to-line capacitors intersect with each other an odd number of times such that currents flow through the capacitors in directions opposite to each other, has been conventionally disclosed (see, for example, Patent Document 1).

CITATION LIST

Patent Document

Patent Document 1: Japanese Patent No. 6113292 (pages 4 and 5, and FIGS. 1 and 2)

SUMMARY OF THE INVENTION

Problems to be Solved by the Invention

In the conventional noise filter, currents flow through the two line-to-line capacitors in directions opposite to each other, and thus magnetic coupling between the two line-to-line capacitors can be reduced. As a result, an attenuation characteristic for normal mode noise can be improved.

However, the residual inductance of each line-to-line capacitor itself cannot be reduced, and thus the attenuation characteristic for normal mode noise cannot be significantly enhanced.

The present invention has been made to solve the above-described problem, and an object of the present invention is to reduce the residual inductance of a line-to-line capacitor itself, thereby further improving an attenuation characteristic for normal mode noise.

Solution to the Problems

A noise filter according to the present invention includes: a first introduction wire having one end that serves as a first introduction end; a second introduction wire having one end that serves as a second introduction end; a third introduction wire having one end that serves as a third introduction end; a fourth introduction wire having one end that serves as a fourth introduction end; a first connection wire connecting another end of the first introduction wire and another end of the fourth introduction wire to each other; a second connection wire connecting another end of the second introduction wire and another end of the third introduction wire to each other; a first capacitor connected between the first introduction wire and the second introduction wire; and a second capacitor connected between the third introduction wire and the fourth introduction wire. The first connection wire and the second connection wire are at least partially parallel to each other.

Effect of the Invention

In the present invention, currents flowing through the first capacitor and the second capacitor which are two line-to-line capacitors are in directions opposite to each other, and meanwhile, currents flowing through the first connection wire and the second connection wire are parallel to each other in the same direction. Thus, the present invention allows the connection wires and the line-to-line capacitors to be magnetically coupled together. As a result, the residual inductance of a line-to-line capacitor itself is reduced, whereby an attenuation characteristic for normal mode noise can be further improved.

DESCRIPTION OF EMBODIMENTS

Embodiment 1

Figure 1:
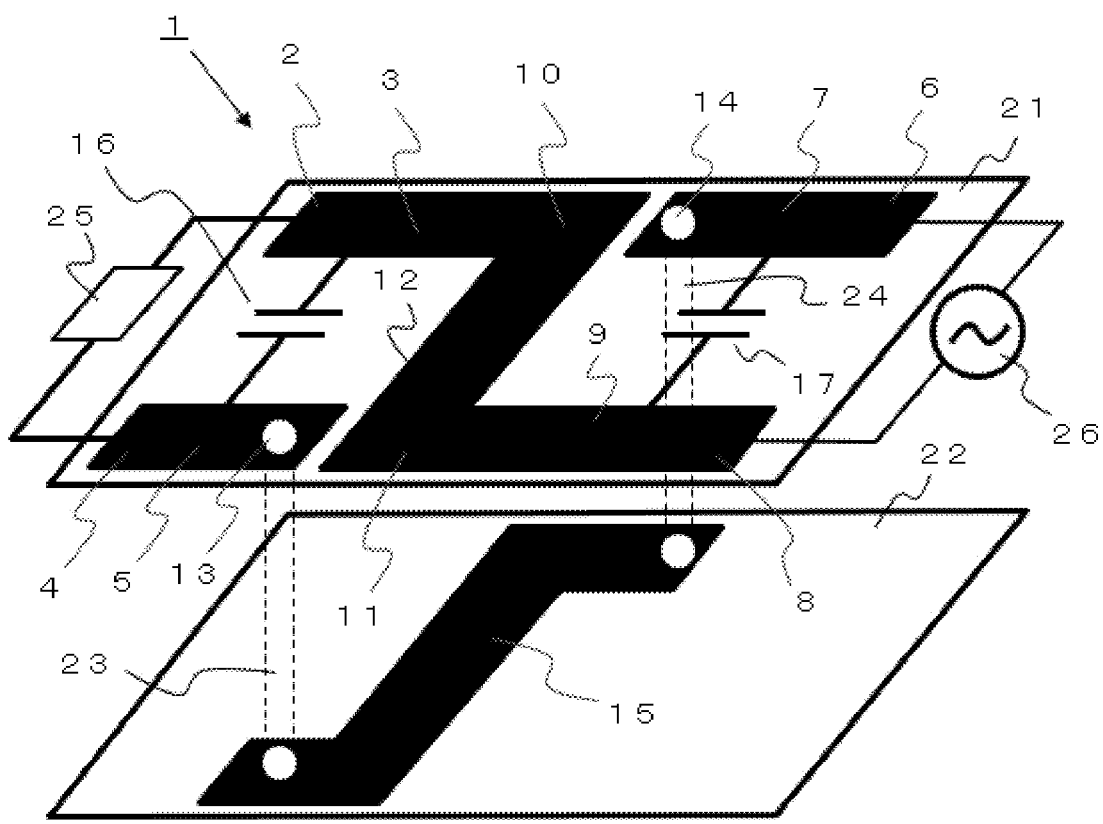
FIG. 1 is a schematic diagram of a noise filter according to embodiment 1 of the present invention.
Figure 1:
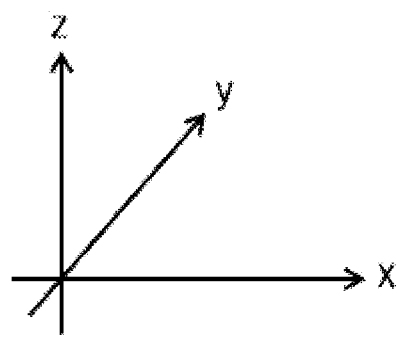

FIG. 1 is a schematic diagram of a noise filter according to embodiment 1 for carrying out the present invention. FIG. 1 is a perspective view schematically showing a wiring pattern of the noise filter in which a printed board having two layers is used. A noise filter 1 according to the present embodiment includes:

- a first introduction wire 3 having one end that serves as a first introduction end 2;
- a second introduction wire 5 having one end that serves as a second introduction end 4;
- a third introduction wire 7 having one end that serves as a third introduction end 6;
- a fourth introduction wire 9 having one end that serves as a fourth introduction end 8;
- a first connection wire 12 connecting another end of the first introduction wire 3 and another end 11 of the fourth introduction wire 9 to each other;
- a second connection wire 15 connecting another end 13 of the second introduction wire 5 and another end 14 of the third introduction wire 7 to each other;
- a first capacitor 16 connected between the first introduction wire 3 and the second introduction wire 5; and
- a second capacitor 17 connected between the third introduction wire 7 and the fourth introduction wire 9.

The printed board in the present embodiment is a printed board having two layers. Ends and wires other than the second connection wire 15 are formed on a first layer 21, and the second connection wire 15 is formed on a second layer 22. The first layer 21 and the second layer 22 are disposed with an insulation layer (not shown) interposed therebetween.

Connection between the second connection wire 15 and the other end 13 of the second introduction wire 5, and connection between the second connection wire 15 and the other end 14 of the third introduction wire 7, are established via through-holes 23 and 24. The first connection wire 12 and the second connection wire 15 are arranged parallel to each other on upper and lower sides with the insulation layer interposed therebetween.

The present embodiment will be described based on the following case. That is, in the noise filter 1, for example, a converter 25 composed of a switching circuit is connected between the first introduction end 2 and the second introduction end 4, and, for example, an AC power supply 26 is connected between the third introduction end 6 and the fourth introduction end 8.

In FIG. 1, a direction vertically penetrating the conductor layers and the insulation layer of the printed board is defined as a z-axis, a direction to which the first connection wire 12 and the second connection wire 15 are parallel is defined as a y-axis, and a direction perpendicular to the z-axis and the y-axis is defined as an x-axis.

Figure 2:
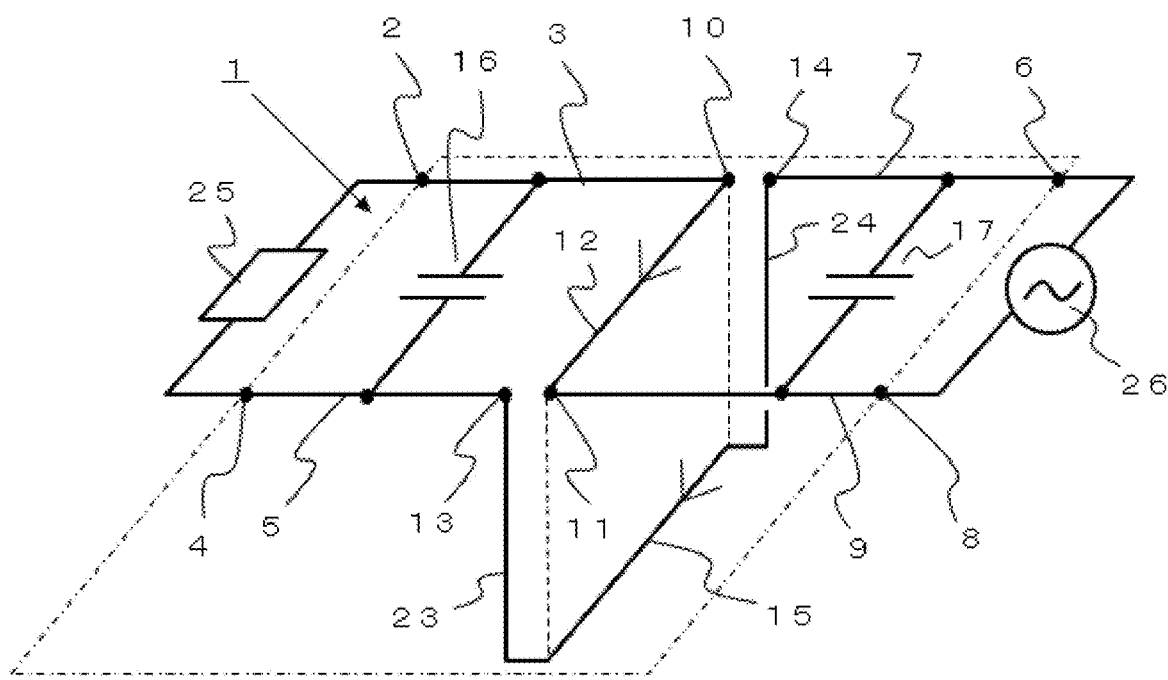
FIG. 2 is a schematic diagram of the noise filter according to embodiment 1 of the present invention.
Figure 2:
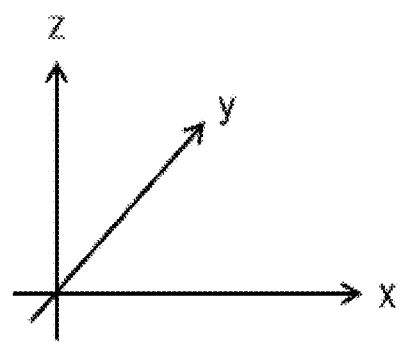

FIG. 2 is a schematic diagram showing a circuit configuration of the noise filter 1 according to the present embodiment. The reference characters in FIG. 2 are matched with the respective reference characters in FIG. 1. The same applies to the xyz-axes. In FIG. 2, the arrows shown on the first connection wire 12 and the second connection wire 15 indicate that the first connection wire 12 and the second connection wire 15 are parallel to each other. An operation of the noise filter according to the present embodiment will be described with reference to FIG. 2. In the following description, current means AC current and refers to, from the viewpoint of the noise filter, noise current generated by a device control signal or a high-frequency signal that is unnecessary for supplying power. The noise current is generated by a resonance phenomenon or rapid temporal changes, in voltage or current, that occur at the time of switching. For conduction noise propagated by transmission of the high-frequency signal through a conductor, prescribed values are set by the International Electrotechnical Commission (IEC) over the range from 150 kHz to 30 MHz, for example. Meanwhile, for radiation noise generated by emission of the high-frequency signal from a conductor into a space, prescribed values are set by the IEC over the range from 30 MHz to 1 GHz. Since such a high-frequency signal causes a malfunction of a device or a breakdown of an electronic circuit inside a device, it is desirable that there is no high-frequency signal. Further, for some vehicular devices and the like, strict prescribed values are set over a wider frequency band. Thus, noise filters such as that according to the present embodiment are used for reducing the noises.

Figure 3:
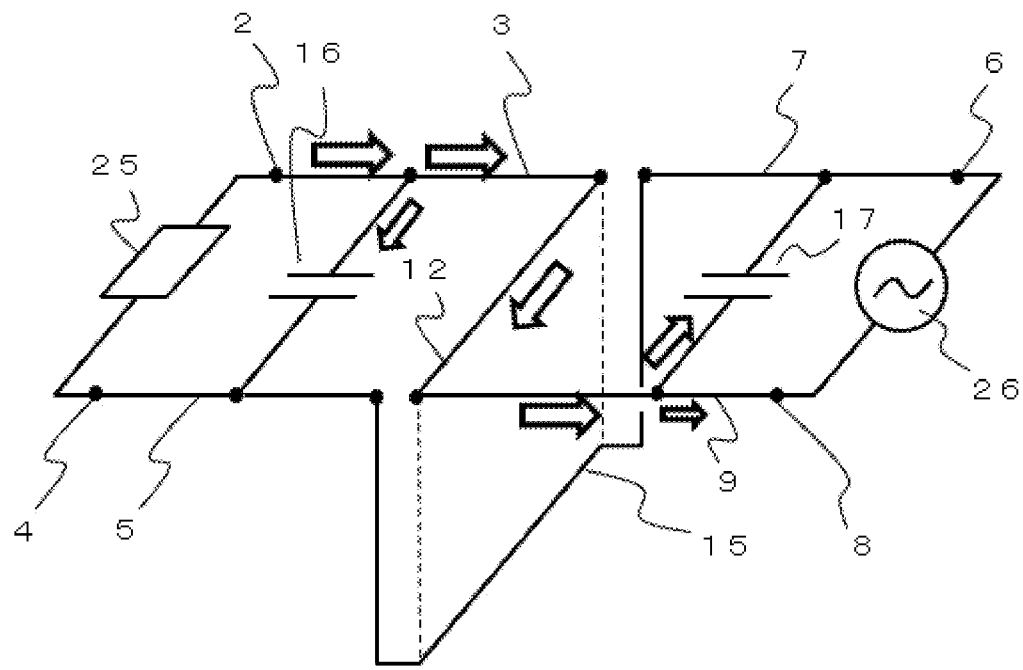
FIG. 3 is a diagram for explaining the noise filter according to embodiment 1 of the present invention.

FIG. 3 is a diagram for explaining an operation of the noise filter 1 according to the present embodiment. In FIG. 3, the arrows indicate the directions of flow of noise currents. Description will be made based on the case in which noise current generated by a high-frequency signal flows into the noise filter 1 from the converter 25 connected between the first introduction end 2 and the second introduction end 4. Description will be made based also on the case in which: the first introduction end 2 serves as a positive electrode; and the second introduction end 4 serves as a negative electrode. The noise current having flowed in from the first introduction end 2 passes through the first introduction wire 3 and is divided into a noise current to flow through the first capacitor 16 and a noise current to flow through the first connection wire 12. Simplification is made here by assuming that the value of the current flowing through the first capacitor 16 and the value of the current flowing through the first connection wire 12 are equal to each other. However, in an actual circuit, since the residual inductance and a residual resistance component of a first capacitor are ordinarily greater than the residual inductance and the residual resistance of a wire, the value of a current flowing through the first capacitor is generally smaller than the value of a current flowing through the first connection wire.

The noise current having flowed through the first capacitor 16 passes via the second introduction wire 5 and the second introduction end 4 and returns to the converter 25. The noise current having flowed through the first connection wire 12 passes via the fourth introduction wire 9 and is divided into a noise current to flow through the second capacitor 17 and a noise current to flow through the AC power supply 26. Simplification is made also here by assuming that the value of the current flowing through the second capacitor 17 is larger than the value of the current flowing through the AC power supply 26. In an actual circuit as well, since the inductance of a wire and an impedance on the AC power supply side including the internal impedance of the AC power supply are greater, the value of the current flowing through the second capacitor 17 is generally larger.

In addition, if the impedance on the AC power supply side is low, a normal mode choke coil or a common mode choke coil generally used as a noise filter may be used as the noise filter according to the present embodiment with respect to the AC power supply. The reason is as follows. That is, with a normal mode choke coil, the impedance on the AC power supply side increases owing to influences on an inductance component and a residual resistance. Meanwhile, with a common mode choke coil, the impedance on the AC power supply side increases owing to influences of leakage magnetic fields on an inductance component and a residual resistance.

The noise current having flowed through the second capacitor 17 passes via the third introduction wire 7 and becomes a noise current to flow through the second connection wire 15. In this manner, the noise current having flowed in from the converter 25 flows inside the noise filter 1.

Figure 4:
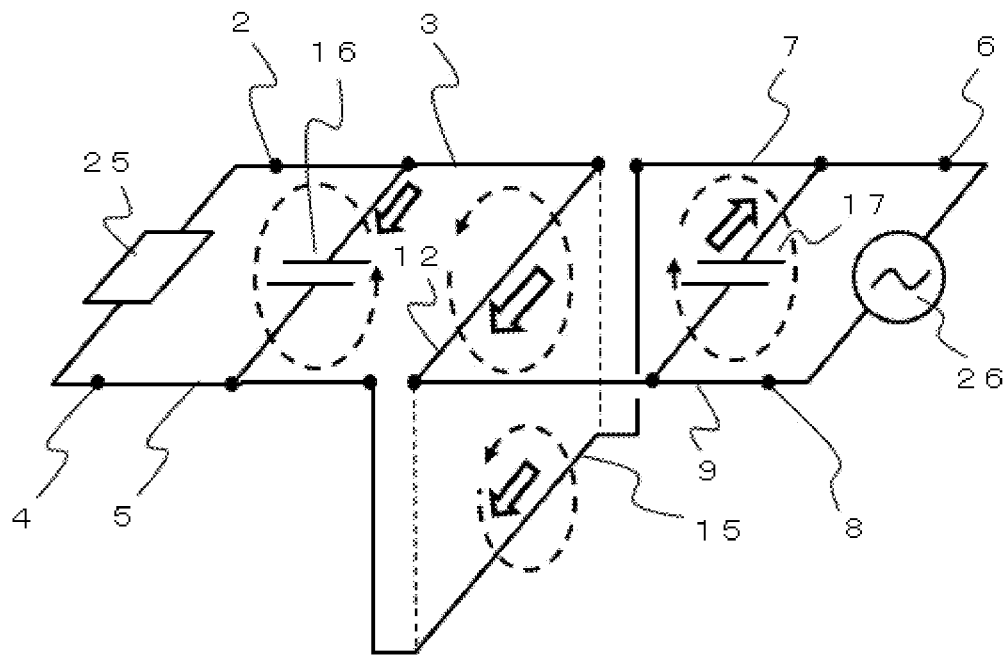
FIG. 4 is a diagram for explaining the noise filter according to embodiment 1 of the present invention.

FIG. 4 is a diagram for explaining an operation of the noise filter 1 according to the present embodiment. In FIG. 4, the loop indicated by broken lines are magnetic fields around the wires generated according to the right-handed screw rule by the noise current having flowed in from the converter 25. Among the magnetic fields shown in FIG. 4, ones having the same direction intensify one another and ones having opposite directions weaken one another. Here, the value of the current flowing through the first capacitor 16 and the value of the current flowing through the first connection wire 12 have been assumed to be equal to each other. Therefore, it can be assumed that, in a region between the first capacitor 16 and the first connection wire 12, magnetic fields generated by the currents flowing through the first capacitor 16 and the first connection wire 12 have substantially the same intensity and have opposite directions and thus are canceled out. Accordingly, the magnetic field remaining in this region is the magnetic field that is generated by the noise current flowing through the second connection wire 15. The same assumption applies also to a region between the second capacitor, and the first connection wire and the second connection wire. In this region, magnetic fields generated by the currents flowing through the second capacitor, and the first connection wire and the second connection wire, have the same direction and thus intensify each other without canceling out each other.

Figure 5:
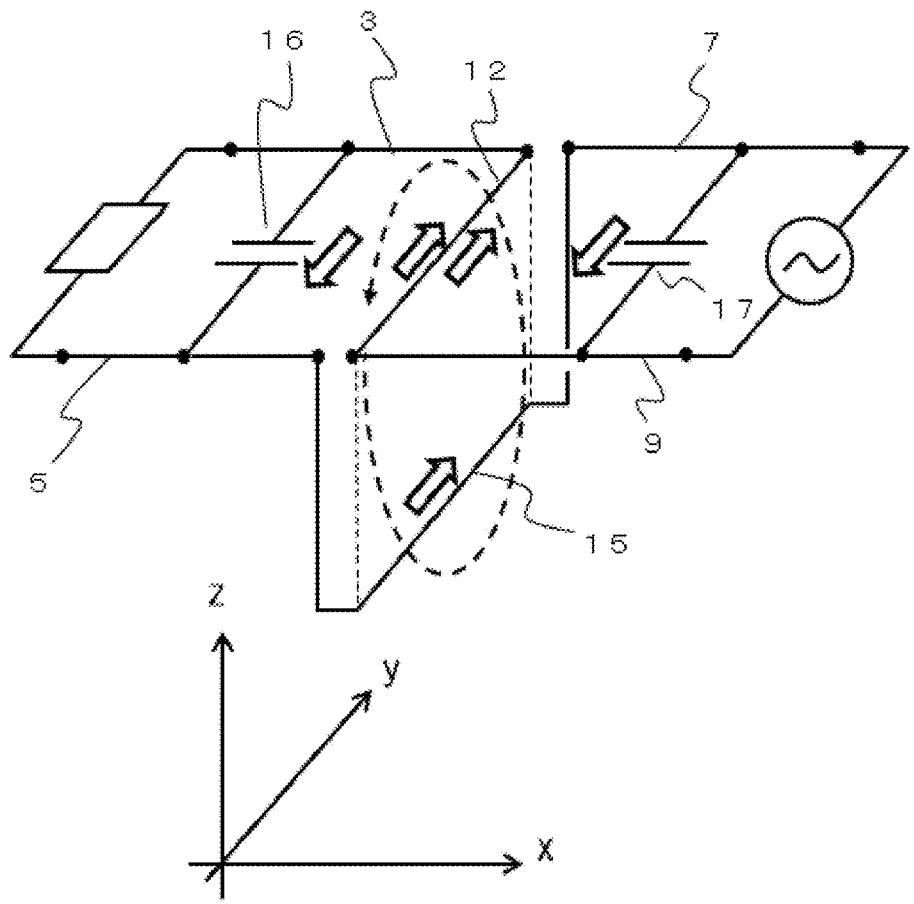
FIG. 5 is a diagram for explaining the noise filter according to embodiment 1 of the present invention.

FIG. 5 is a diagram for explaining a magnetic field generated in the noise filter according to the present embodiment and induced currents generated by induced electromotive forces due to the magnetic field. In FIG. 5, a magnetic field generated in the region between the first capacitor 16, and the first connection wire 12 and the second connection wire 15, can be considered to be a magnetic field penetrating an imaginary loop that is formed by the first capacitor 16, the second introduction wire 5, the first connection wire 12, and the first introduction wire 3, as seen in the z-axis direction. Thus, an induced electromotive force is generated according to Lenz's law at each of the locations that form the imaginary loop. Similarly, a magnetic field generated in a region between the second capacitor 17, and the first connection wire 12 and the second connection wire 15, can be considered to be a magnetic field penetrating an imaginary loop that is formed by the second capacitor 17, the fourth introduction wire 9, the first connection wire 12, and the third introduction wire 7, as seen in the z-axis direction. Thus, an induced electromotive force is generated according to Lenz's law at each of the locations that form the imaginary loop.

Further, the first connection wire 12 and the second connection wire 15 are included within a magnetic field formed by: the magnetic field penetrating the region among the first capacitor 16, the second introduction wire 5, the first connection wire 12, and the first introduction wire 3 in the negative z-direction; and the magnetic field penetrating the region among the second capacitor 17, the fourth introduction wire 9, the first connection wire 12, and the third introduction wire 7 in the positive z-direction. Accordingly, induced electromotive forces are generated according to Lenz's law at the first connection wire 12 and the second connection wire 15. The induced electromotive force is called counter-electromotive force as well. However, in the present embodiment, the term "induced electromotive force" is consistently used throughout the description.

The arrows indicated in FIG. 5 indicate induced currents generated by the induced electromotive forces. At the first capacitor 16, an induced current is generated in a direction from the first introduction wire 3 to the second introduction wire 5. At the second capacitor 17, an induced current is generated in a direction from the third introduction wire 7 to the fourth introduction wire 9. At the first connection wire, an induced current is generated in a direction from the fourth introduction wire 9 to the first introduction wire 3. At the second connection wire 15, an induced current is generated in a direction from the second introduction wire 5 to the third introduction wire 7.

In the case where the induced electromotive forces are considered, the above-described imaginary loops are assumed as a closed loop. A condition of assuming the imaginary loops as a closed loop is described as follows. That is, the phase of a current flowing through the second introduction wire 5 lags behind the phases of currents flowing through the first introduction wire 3, the first connection wire 12, and the first capacitor 16 according to the length of wiring including the fourth introduction wire 9, the second capacitor 17, and the third introduction wire 7. However, if an electrical length based on the lengths of the second introduction wire 5 and the wiring including the fourth introduction wire 9, the second capacitor 17, and the third introduction wire 7 is smaller than ½ the wavelength of current, the lag of the phase can be ignored. Thus, it can be considered that one closed loop is formed.

As an example, a case will be assumed in which a noise filter for attenuating a noise current having a frequency of 100 MHz is formed. If the total length of the fourth introduction wire 9, the second capacitor 17, the third introduction wire 7, and the second introduction wire of the noise filter is set to 0.1 m, since the wavelength is 3 m at 100 MHz, the wiring length/wavelength is 0.1 m/3 m, i.e., smaller than ½. Accordingly, the imaginary loops can be assumed as one closed loop. Meanwhile, in the case of a noise current having a frequency of 1 GHz with the same noise filter, since the wavelength is 0.3 m at 1 GHz, the wiring length/wavelength is 0.1 m/0.3 m, i.e., smaller than ½. Accordingly, in this case as well, the imaginary loops can be assumed as one closed loop. The wiring length/wavelength being ½ is the minimum requirement, and a lower value of the ratio is more desirable. Therefore, the wiring length in the noise filter is desirably shortened.

Figure 6:
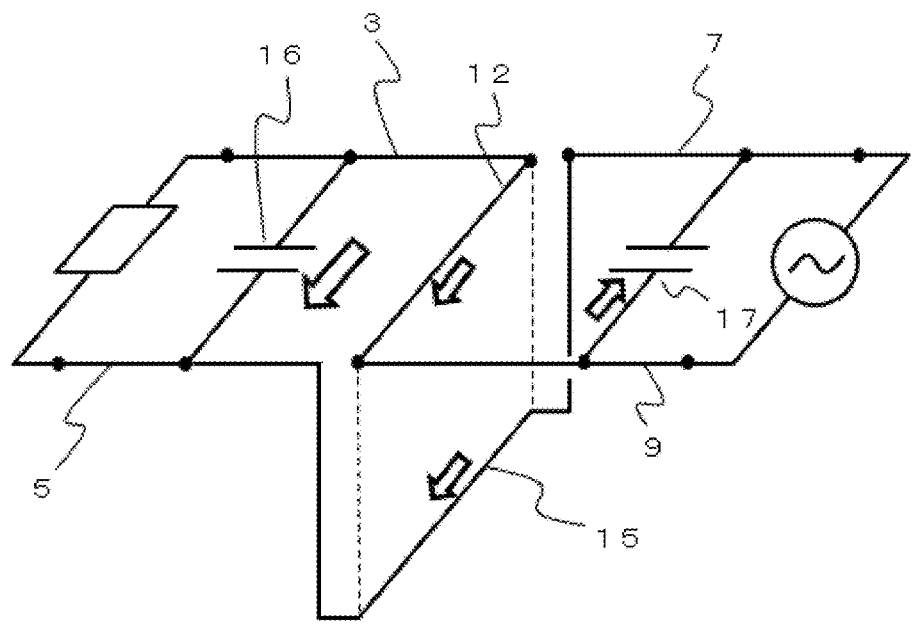
FIG. 6 is a diagram for explaining the noise filter according to embodiment 1 of the present invention.

FIG. 6 is a diagram for explaining the flow of currents synthesized from: the noise currents (shown in FIG. 3) generated by the high-frequency signal from the converter 25 into the noise filter 1; and the induced currents (shown in FIG. 5) generated by induced electromotive forces. In FIG. 6, the sizes of the arrows in the drawing qualitatively indicate the magnitudes of the currents, and a larger arrow indicates a larger amount of the current. As shown in FIG. 6, a current flowing through the first capacitor 16 becomes larger owing to magnetic fields generated by currents flowing through the first connection wire 12 and the second connection wire 15. Meanwhile, it is seen that the currents flowing through the first connection wire 12 and the second connection wire 15 become smaller, and a current flowing through the second capacitor 17 also becomes smaller. In other words, the apparent residual inductance of the first capacitor 16 decreases, and the current flowing through the first capacitor 16 increases. Meanwhile, the apparent residual inductances of the first connection wire 12 and the second connection wire 15 increase, and the currents flowing through the first connection wire 12 and the second connection wire 15 decrease.

Decrease in the current flowing through the second capacitor 17 poses a disadvantage to the noise filter in normal mode. However, an advantage of increasing the residual inductances of the first connection wire 12 and the second connection wire 15 and reducing the residual inductance of the first capacitor 16 to facilitate flow of current therethrough, surpasses the disadvantage.

As described above, in the noise filter according to the present embodiment, the first connection wire 12 and the second connection wire 15 are at least partially parallel to each other, and thus a current flowing through the first capacitor 16 becomes larger owing to magnetic fields generated by currents flowing through the first connection wire 12 and the second connection wire 15. As a result, the residual inductance of the line-to-line capacitor itself is reduced, whereby an attenuation characteristic for normal mode noise can be further improved.

Next, the effect of improving the attenuation characteristic of the noise filter according to the present embodiment for normal mode noise will be described more in detail.

Figure 7:
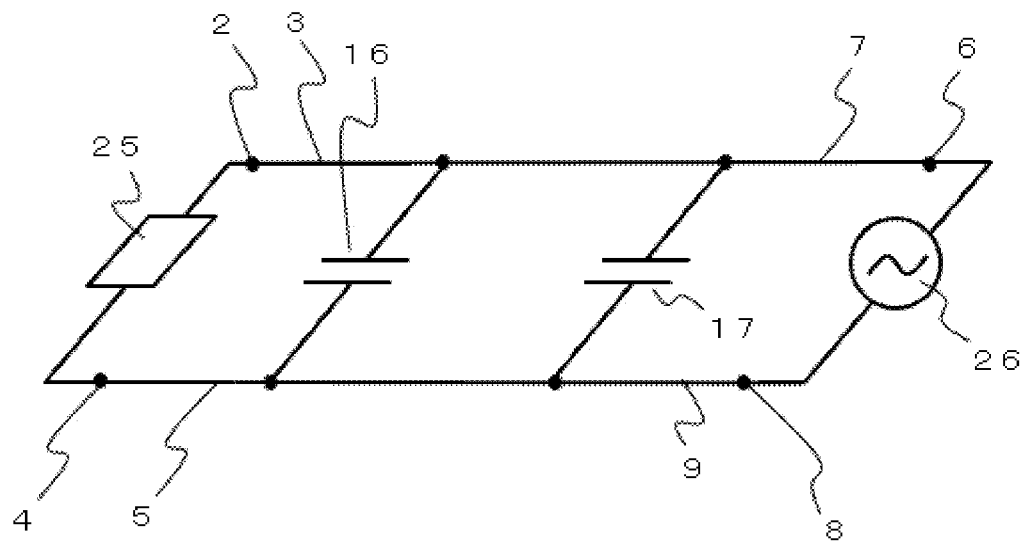
FIG. 7 is a schematic diagram of the noise filter according to embodiment 1 of the present invention.

FIG. 7 is a schematic diagram of a comparative conventional noise filter. FIG. 7 shows a noise filter that is similar to the noise filter according to the present embodiment and that has a configuration provided with neither the first connection wire nor the second connection wire. In this noise filter, the first introduction wire 3 and the third introduction wire 7 are directly connected to each other, and the second introduction wire 5 and the fourth introduction wire 9 are directly connected to each other. Thus, the direction of a current flowing through the first capacitor 16 and the direction of a current flowing through the second capacitor 17 are the same as each other. Therefore, regarding magnetic fields between the two capacitors, magnetic fields having the same intensity are generated in opposite directions, and the magnetic fields cancel each other out. As a result, induced currents are not generated in the respective capacitors, and thus the attenuation characteristic for normal mode noise is not improved as in the noise filter according to the present embodiment.

In addition, the conventional noise filter shown in FIG. 7 can be regarded as a filter composed of one capacitor having a capacitance in which the capacitances of the two capacitors are added up. In contrast, employment of the structure of the present embodiment allows increase in the residual inductances of the first connection wire 12 and the second connection wire 15, whereby this structure functions as a structure in which inductors are interposed on the wires that connect the two line-to-line capacitors to each other. This structure is the same structure as that of a n-type filter known to have a great noise reduction effect for normal mode. With combination of the effect of the n-type filter and reduction in the residual inductance of the first capacitor 16, a filter having a great noise reduction effect for normal mode is obtained.

Figure 8:
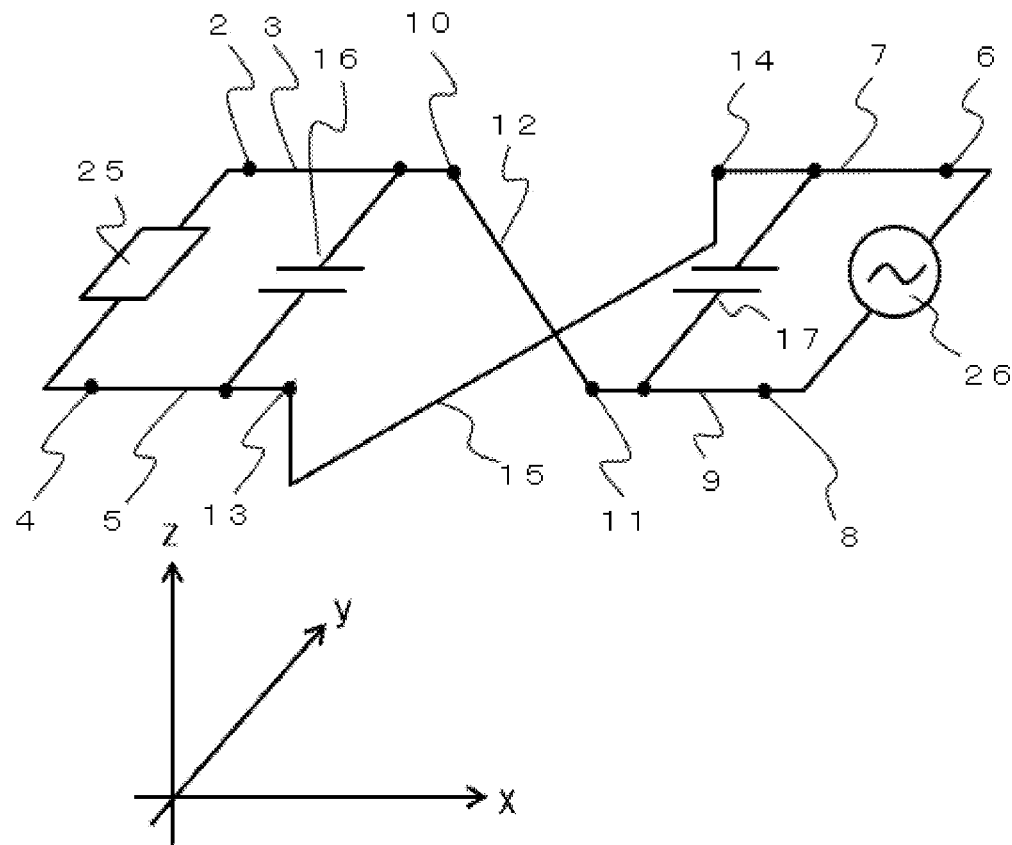
FIG. 8 is a schematic diagram of the noise filter according to embodiment 1 of the present invention.
Figure 9:
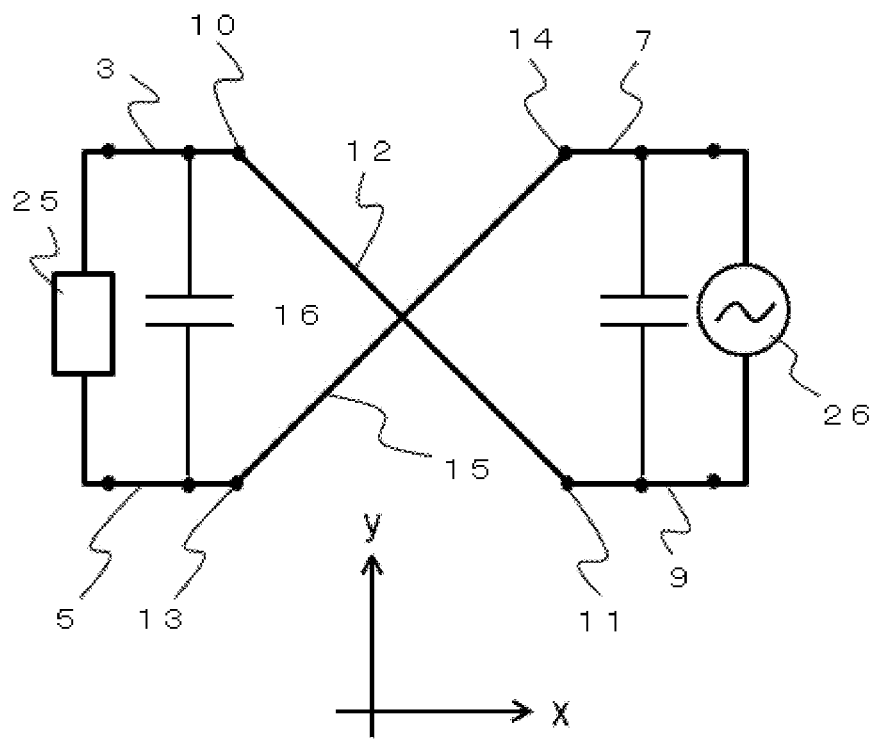
FIG. 9 is a schematic diagram of the noise filter according to embodiment 1 of the present invention.

FIG. 8 is a schematic diagram of a comparative conventional noise filter. FIG. 8 shows a noise filter that is similar to the noise filter according to the present embodiment and that has a configuration in which the first connection wire and the second connection wire intersect with each other. FIG. 9 is a schematic diagram of the conventional noise filter shown in FIG. 8, as seen in the z-axis direction. In this noise filter, the other end 10 of the first introduction wire 3 and the other end 11 of the fourth introduction wire 9 are connected to each other by the first connection wire 12, and the other end 13 of the second introduction wire 5 and the other end 14 of the third introduction wire 7 are connected to each other by the second connection wire 15. Thus, the direction of a current flowing through the first capacitor 16 and the direction of a current flowing through the second capacitor 17 are opposite to each other. Therefore, magnetic coupling between the two line-to-line capacitors can be suppressed, and thus the attenuation characteristic for normal mode noise can be exhibited. However, since the first connection wire and the second connection wire intersect with each other, magnetic fields around the wires generated according to the right-handed screw rule owing to currents flowing through the respective wires do not weaken or intensify each other. Therefore, the effect of reducing the residual inductance of a line-to-line capacitor itself to further improve the attenuation characteristic for normal mode noise, is not obtained.

Figure 10:
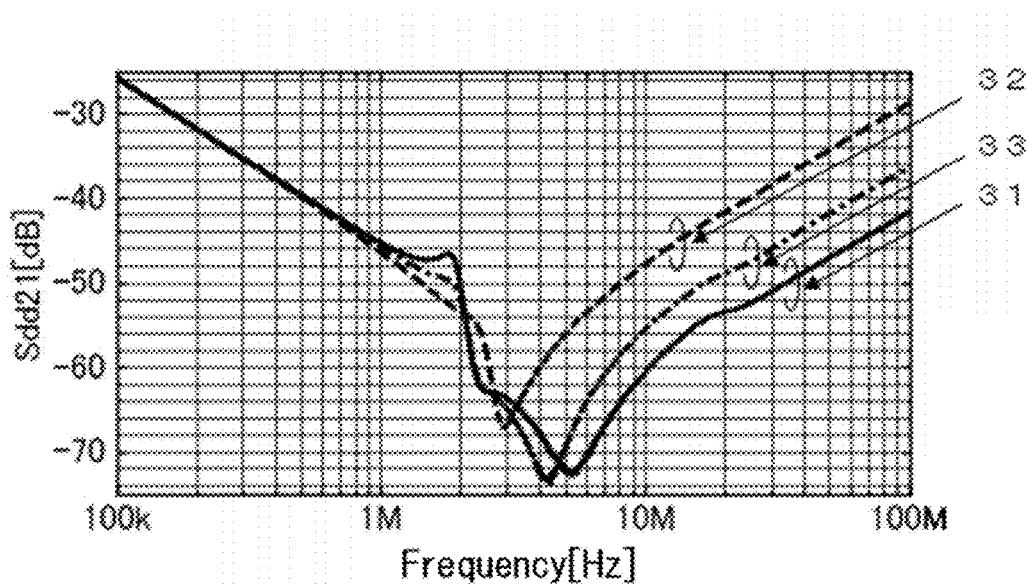
FIG. 10 is a characteristic graph of the noise filter according to embodiment 1 of the present invention.

FIG. 10 is a characteristic graph indicating the measured value of attenuation characteristics of the noise filter according to the present embodiment. In FIG. 10, the horizontal axis expresses frequency, and the vertical axis expresses a mixed-mode S-parameter (Sdd21) indicative of attenuation performance for normal mode noise. When a positive or negative signal is inputted between the first introduction end 2 and the second introduction end 4 of the noise filter, a positive or negative signal is outputted between the third introduction wire 7 and the fourth introduction end 8, and Sdd21 is expressed as the ratio of the amplitude of the outputted signal to the amplitude of the inputted signal. Therefore, a smaller value of Sdd21 indicates that the attenuation performance of the noise filter is higher.

In FIG. 10, a solid line 31 indicates the attenuation characteristic of the noise filter according to the present embodiment shown in FIG. 2, a broken line 32 indicates the attenuation characteristic of the conventional noise filter (shown in FIG. 7) having the configuration provided with neither the first connection wire nor the second connection wire, and an alternate long and short dashed line 33 indicates the attenuation characteristic of the conventional noise filter (shown in FIG. 8) having the configuration in which the first connection wire and the second connection wire intersect with each other. As each of the first capacitors and the second capacitors of the noise filters used for measurement in FIG. 10, a capacitor with a model number LE334 (0.33 µF, dimension: 17.5 mm×17.5 mm×9.5 mm) among polyester film capacitors manufactured by OKAYA ELECTRIC INDUSTRIES CO., LTD., was used. The distance between the capacitors, and the lengths of and the distance between wires other than the first connection wire and the second connection wire were set to be equal.

In FIG. 10, a frequency at which the value of Sdd21 is smallest is referred to as a resonance frequency. It is found that the attenuation performance at a frequency higher than the resonance frequency differs among the noise filters shown in FIG. 10. In particular, if the noise filter according to the present embodiment is compared with the conventional noise filter having the configuration in which the first connection wire and the second connection wire intersect with each other, it is found that the attenuation characteristic of the noise filter according to the present embodiment is improved by about 8 dB over the entire range of frequencies higher than the resonance frequency.

At frequencies lower than the resonance frequency, the attenuation characteristic is generally determined by the capacitance component of a capacitor rather than the residual inductance of the capacitor. In contrast, at frequencies higher than the resonance frequency, the attenuation characteristic is determined by the residual inductance of the capacitor. It is seen that, in the noise filter according to the present embodiment, the attenuation characteristic for normal mode noise is improved in this frequency band. In order to improve the attenuation characteristic in a band of frequencies lower than the resonance frequency, a capacitor having a high capacitance component may be used, and the noise filter according to the present embodiment allows improvement in the attenuation characteristic for normal mode noise if any capacitor is used.

In the present embodiment, an example has been described in which: the noise filter is connected between the AC power supply and the converter composed of a switching circuit; and a noise generated from the converter is attenuated. However, the noise filter is applicable to another noise. Examples of the noise to which the noise filter is applicable include noises mixed in artificially generated signals, such as: noises generated from digital devices represented by noises caused by switching circuits and clock pulses; noises from devices using high frequency represented by noises caused by relay circuits, electric discharge from thermostats, commutator motors, small-sized electrical devices such as semiconductor control devices, electrical discharge machines, and heaters; noises from power substations represented by noises caused by electric discharge from insulators; noises from devices related to automobiles and trains represented by noises caused by ignition devices and electric discharge from pantographs; and noises from radio equipment represented by noises caused by broadcasting, radio communication, radars, and portable telephones. In addition, the noise filter is applicable also to noises generated in nature such as noises caused by lightning discharge, solar wind, astronomical radio sources, and electrostatic discharge.

In the present embodiment, the noise filter is connected between the converter and the AC power supply. However, a DC power supply or the like may be used instead of the AC power supply. Alternatively, any component may be connected as long as the component is not a circuit that generates a high-frequency signal, such as a switching element. However, since the noise filter has a high level of symmetry, effects as a noise filter are not lost even if the noise filter is interposed between circuits that generate high-frequency signals.

In addition, in the noise filter according to the present embodiment, the first connection wire and the second connection wire are arranged parallel to each other along the width direction of the printed board having two layers, i.e., the z-axis direction shown in FIG. 1. Accordingly, it is not necessary to increase the distance between the converter 25 and the AC power supply 26 connected to the noise filter, i.e., the size in the x-axis direction of the noise filter shown in FIG. 1.

Figure 11:
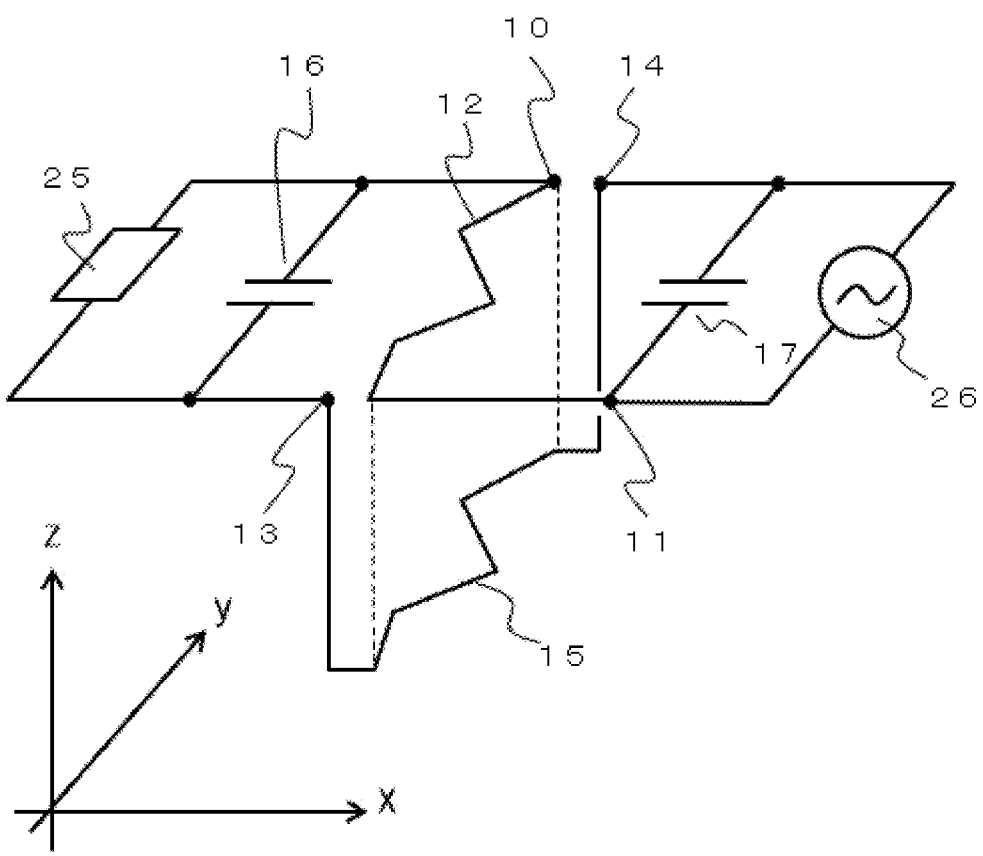
FIG. 11 is a schematic diagram of the noise filter according to embodiment 1 of the present invention.

FIG. 11 is a schematic diagram showing a circuit configuration of another noise filter according to the present embodiment. In the noise filter shown in FIG. 1 and FIG. 2, both the first connection wire 12 and the second connection wire 15 are linear and arranged parallel to each other along the z-axis direction. Meanwhile, in the other noise filter shown in FIG. 11, the first connection wire 12 and the second connection wire 15 are bent while being parallel to each other along the z-axis direction in the bent state.

Also in the noise filter which is thus configured, a current flowing through the first capacitor 16 becomes large owing to magnetic fields generated by currents flowing through the first connection wire 12 and the second connection wire 15. As a result, the residual inductance of the line-to-line capacitor itself is reduced, whereby the attenuation characteristic for normal mode noise can be further improved.

Figure 12:
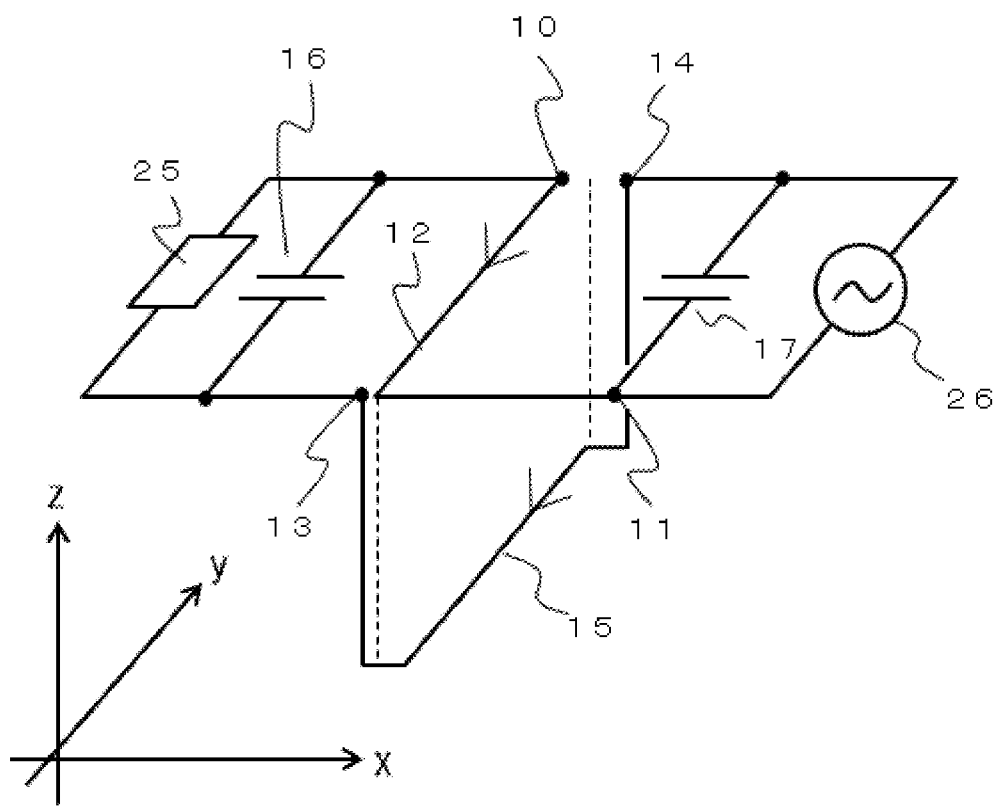
FIG. 12 is a schematic diagram of the noise filter according to embodiment 1 of the present invention.
Figure 13:
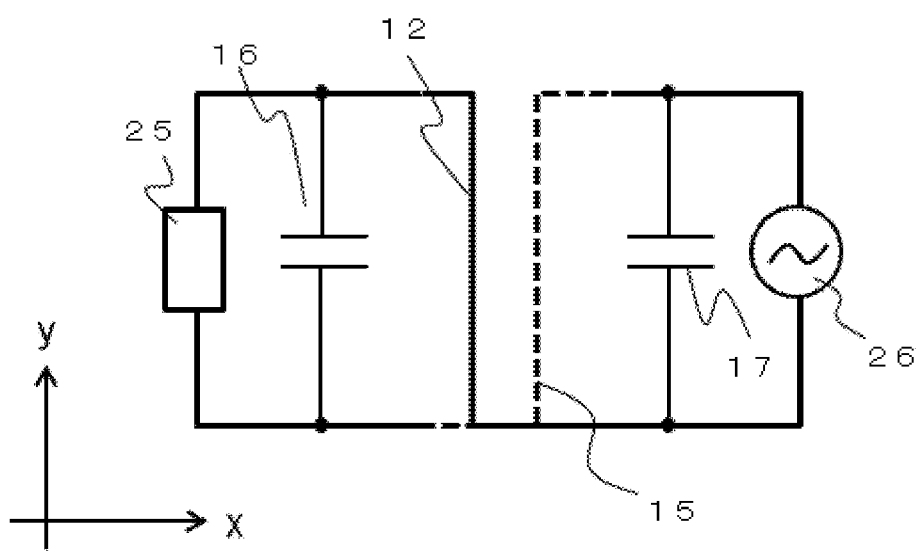
FIG. 13 is a schematic diagram of the noise filter according to embodiment 1 of the present invention.

FIG. 12 is a schematic diagram showing a circuit configuration of another noise filter according to the present embodiment. In the noise filter shown in FIG. 1 and FIG. 2, both the first connection wire 12 and the second connection wire 15 are linear and arranged parallel to each other along the z-axis direction. Meanwhile, in the other noise filter shown in FIG. 12, although both the first connection wire 12 and the second connection wire 15 are linear and parallel to each other, they are displaced from each other in the x-axis direction. FIG. 13 is a schematic diagram of the noise filter shown in FIG. 12, as seen from the z-axis direction. As shown in FIG. 13, although both the first connection wire 12 and the second connection wire 15 of the noise filter are linear and displaced from each other in the x-axis direction, they are arranged parallel to each other in the y-axis direction.

Also in the noise filter which is thus configured, a current flowing through the first capacitor 16 becomes large owing to magnetic fields generated by currents flowing through the first connection wire 12 and the second connection wire 15. As a result, the residual inductance of the line-to-line capacitor itself is reduced, whereby the attenuation characteristic for normal mode noise can be further improved.

In the present embodiment, the first connection wire 12 and the second connection wire 15 are arranged parallel to each other. However, they do not necessarily have to be completely parallel to each other but only have to be such that an induced current flowing through the first capacitor 16 becomes large by induced electromotive forces due to magnetic fields generated by currents flowing through the first connection wire 12 and the second connection wire 15. Thus, the first connection wire 12 and the second connection wire 15 may be displaced so as not to be completely parallel to each other within such a range that the said effect is exhibited.

As the first capacitor and the second capacitor, various types of capacitors such as a laminated ceramic capacitor, a film capacitor, and an electrolytic capacitor can be used. If the noise filter is configured as in the present embodiment, the attenuation characteristic for normal mode noise can be improved regardless of the types of the capacitors. The improvement is attributed to the following structure. That is, generation of the induced electromotive forces makes it easy for a current to flow through the first capacitor and makes it difficult for currents to flow through the first connection wire and the second connection wire, whereby effects as the noise filter are improved.

In many cases, two smoothing capacitors are used between switching circuits such as a converter circuit and an inverter circuit in order to suppress ripple. If the configuration described in the present embodiment is employed for the two smoothing capacitors, the inductances of the smoothing capacitors which have high residual inductances can also be reduced, and thus the smoothing capacitors can be caused to function also as noise filters. Accordingly, neither an additional part for a noise filter nor a mounting space therefor are necessary. In addition, a noise generated in one of the circuits can be prevented from entering the other circuit, and thus the converter circuit and the inverter circuit can be stably operated.

Figure 14:
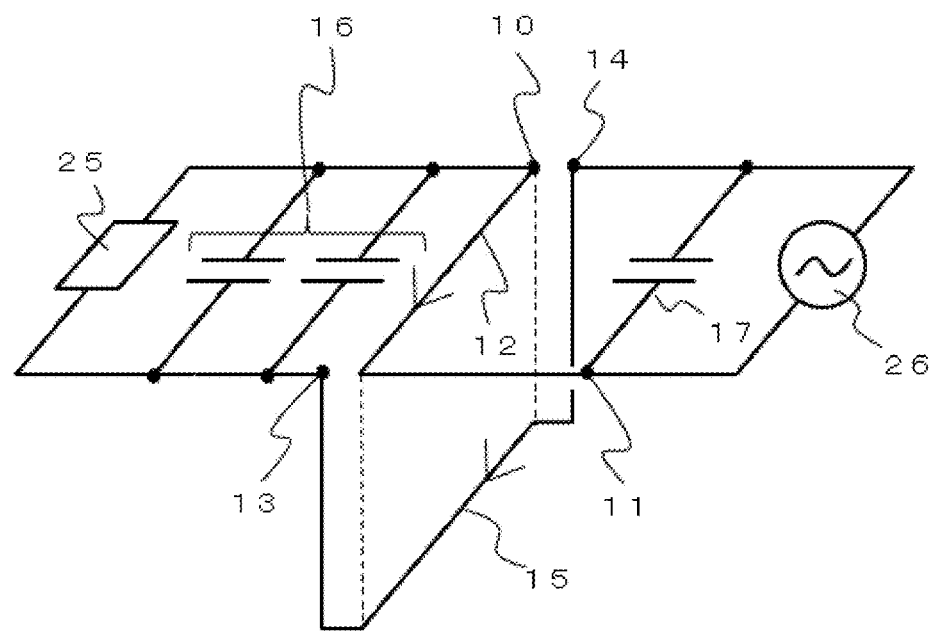
FIG. 14 is a schematic diagram of the noise filter according to embodiment 1 of the present invention.

FIG. 14 is a schematic diagram showing a circuit configuration of another noise filter according to the present embodiment. As shown in FIG. 14, the first capacitor 16 is composed of two capacitors connected in parallel. In this manner, the first capacitor and the second capacitor may be composed of capacitors with combinations of connection in series and connection in parallel.

Although the printed board is used for the noise filter in the present embodiment, the noise filter may be composed of conducting bars such as bus bars and conducting wire members such as lead wires without using any printed board. Alternatively, the noise filter may be formed with combinations of a printed board, lead wires, and the like.

Embodiment 2

As seen from FIG. 2, in the noise filter described in embodiment 1, a pair of the first introduction end and the second introduction end and a pair of the third introduction end and the fourth introduction end are equivalent to each other. That is, one of the pairs serves as an input end portion, and the other pair serves as an output end portion. In embodiment 1, noise current flows in from the first introduction end. Meanwhile, in embodiment 2, an example in which noise current flows in from the third introduction end will be described.

Figure 15:
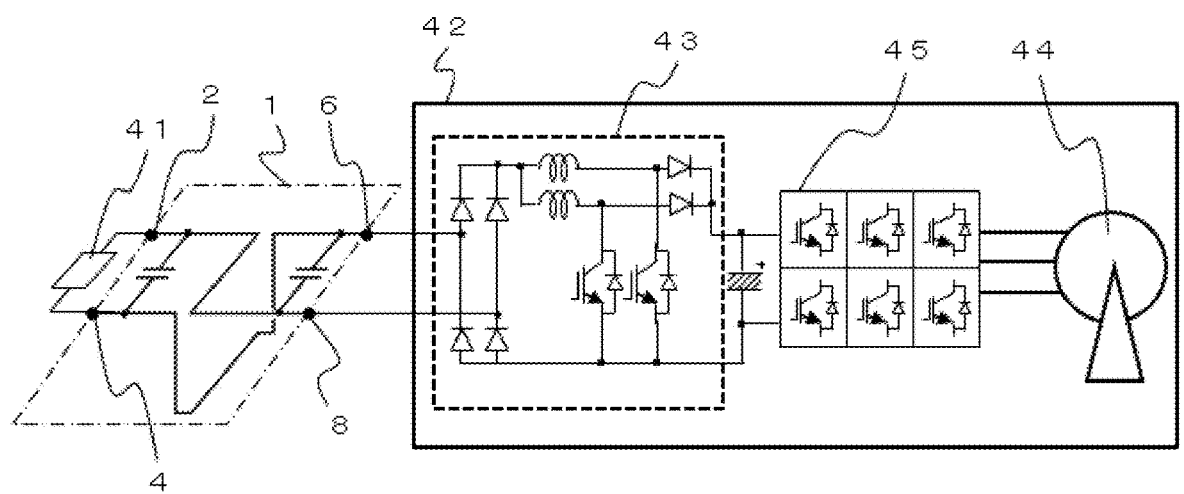
FIG. 15 is a schematic diagram of a converter device according to embodiment 2 of the present invention.

FIG. 15 is a schematic diagram explaining a case where a noise filter is provided between a power supply and an outdoor unit for an air conditioner, in the present embodiment. In FIG. 15, in the noise filter 1, a commercial power supply (AC power supply) 41 is connected between the first introduction end 2 and the second introduction end 4, and an outdoor unit 42 is connected between the third introduction end 6 and the fourth introduction end 8. The outdoor unit 42 includes: a converter circuit 43 which converts, into DC power, AC power supplied from the commercial power supply 41 via the noise filter 1; and an inverter circuit 45 which supplies, on the basis of the DC power outputted from the converter circuit 43, three-phase drive power for controlling a motor 44. The converter circuit 43 and the inverter circuit 45 include switching elements. This noise filter has the same configuration as that in embodiment 1.

In the present embodiment, noise current caused by a switching circuit flows into the noise filter from the side where there is the outdoor unit 42 provided with the switching elements. In the noise filter according to the present embodiment, the first connection wire and the second connection wire are at least partially parallel to each other, and thus a current flowing through the second capacitor becomes large owing to magnetic fields generated by noise currents flowing through the first connection wire and the second connection wire. As a result, the residual inductance of the line-to-line capacitor itself is reduced, whereby the attenuation characteristic for normal mode noise can be further improved.

Although an interleaved boost converter is used as an example of the converter circuit 43 in the present embodiment, any converter circuit may be used as the converter circuit 43. Inverter circuits, converter circuits, and the like are mainly formed using semiconductors made from silicon. However, wide band gap semiconductors that are made from silicon carbide, gallium nitride, gallium oxide, diamond, or the like and that are higher in power conversion efficiency and operated at high speed while having small sizes, have been used in recent years. Since these wide band gap semiconductors can be operated at high speed, rise times and fall times are short and switching loss can be reduced as compared to the case of conventional semiconductors made from silicon. Meanwhile, the wide band gap semiconductors are more likely to generate high-frequency signals, resulting in generation of noise currents having large amplitudes. However, even with converter circuits formed using wide band gap semiconductors that result in noise currents having large amplitudes, use of the noise filter according to the present embodiment allows the attenuation characteristic for normal mode noise to be further improved without any increase in the dimension of and cost for the filter.

Embodiment 3

Figure 16:
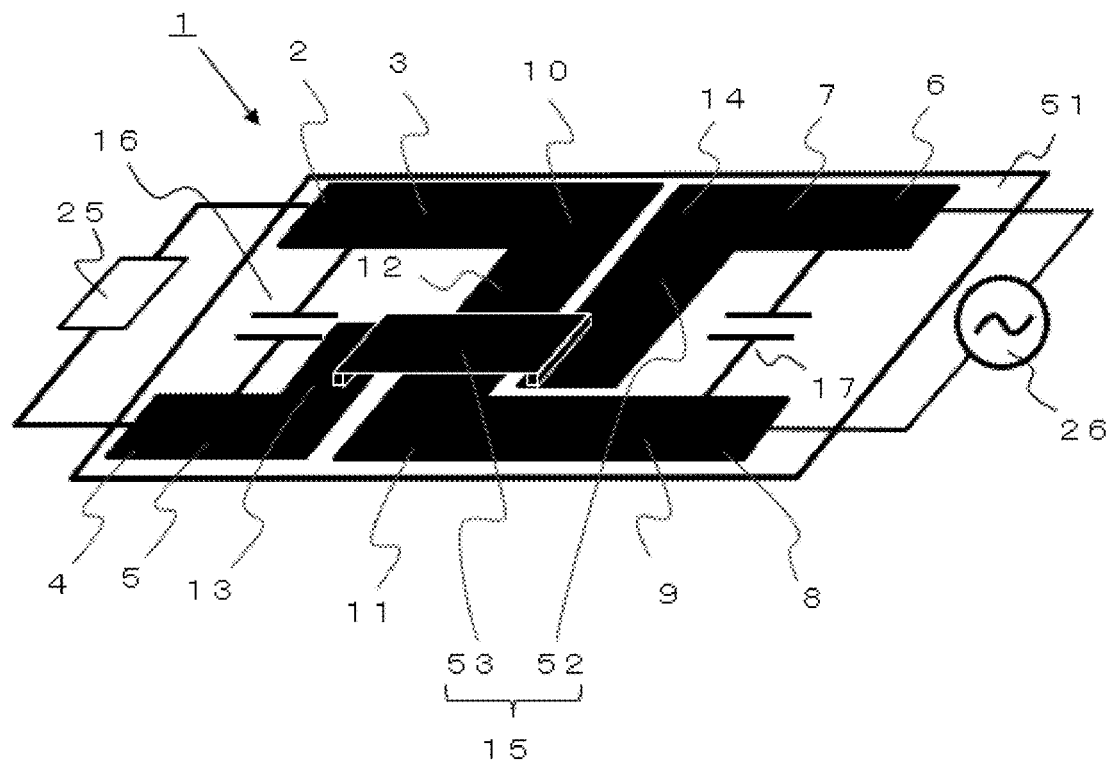
FIG. 16 is a schematic diagram of a noise filter according to embodiment 3 of the present invention.

FIG. 16 is a schematic diagram of a noise filter according to embodiment 3 for carrying out the present invention. FIG. 16 is a perspective view schematically showing a wiring pattern of the noise filter in which a printed board 51 having one layer is used. The noise filter 1 according to the present embodiment includes: the first introduction wire 3 having one end that serves as the first introduction end 2; the second introduction wire 5 having one end that serves as the second introduction end 4; the third introduction wire 7 having one end that serves as the third introduction end 6; the fourth introduction wire 9 having one end that serves as the fourth introduction end 8; the first connection wire 12 connecting the other end 10 of the first introduction wire 3 and the other end 11 of the fourth introduction wire 9 to each other; the second connection wire 15 connecting the other end 13 of the second introduction wire 5 and the other end 14 of the third introduction wire 7 to each other; the first capacitor 16 connected between the first introduction wire 3 and the second introduction wire 5; and the second capacitor 17 connected between the third introduction wire 7 and the fourth introduction wire 9.

In the noise filter according to the present embodiment, the second connection wire 15 is composed of a wire portion 52 formed on a surface of the printed board 51 and a jumper wire 53 connecting the wire portion 52 and the other end 13 of the second introduction wire 5 to each other. The wire portion 52 is formed parallel to the first connection wire 12, and the jumper wire 53 is formed across the first connection wire 12.

Further, in the noise filter 1, the converter 25 is connected between the first introduction end 2 and the second introduction end 4, and the AC power supply 26 is connected between the third introduction end 6 and the fourth introduction end 8.

In the noise filter which is thus configured, noise current that has flowed in from the converter 25 is such that, as in embodiment 1, the direction of a noise current flowing through the first connection wire 12 and the direction of a noise current flowing through the second connection wire 15 are the same as each other. In addition, the first connection wire 12 and the wire portion 52 of the second connection wire 15 are parallel to each other.

In this manner, in the noise filter according to the present embodiment, the first connection wire 12 and the second connection wire 15 are at least partially parallel to each other, and thus a current flowing through the first capacitor 16 becomes large owing to magnetic fields generated by currents flowing through the first connection wire 12 and the second connection wire 15. As a result, the residual inductance of the line-to-line capacitor itself is reduced, whereby the attenuation characteristic for normal mode noise can be further improved.

In the noise filter shown in FIG. 16, the second connection wire 15 is composed of the wire portion formed on the surface of the printed board and the jumper wire extending across the first connection wire 12. However, the first connection wire 12 may be composed of the wire portion formed on the surface of the printed board and the jumper wire extending across the second connection wire 15.

Figure 17:
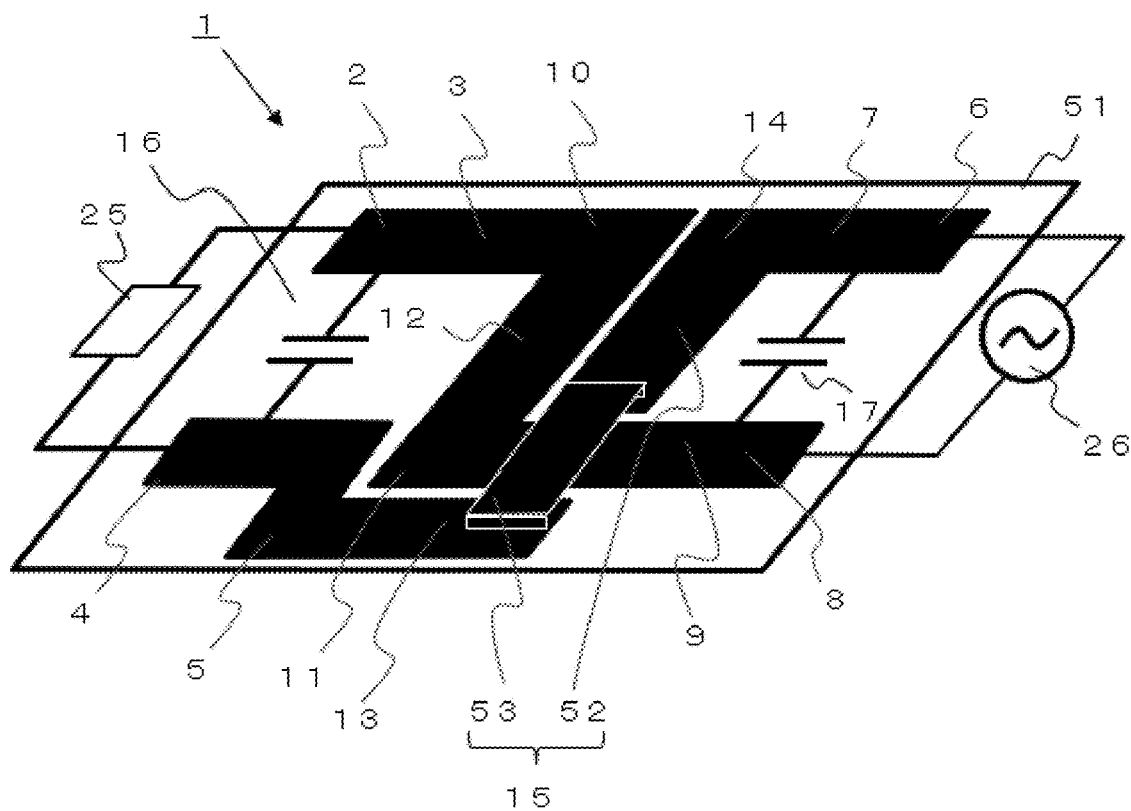
FIG. 17 is a schematic diagram of the noise filter according to embodiment 3 of the present invention.

FIG. 17 is a schematic diagram of another noise filter according to the present embodiment. In the noise filter shown in FIG. 16, the second connection wire 15 is composed of the wire portion 52 formed parallel to the first connection wire 12 and the jumper wire 53 extending across the first connection wire 12. Meanwhile, in the noise filter shown in FIG. 17, the second connection wire 15 is composed of the wire portion 52 formed parallel to the first connection wire 12 and the jumper wire 53 extending across the fourth introduction wire 9.

Also in the noise filter which is thus configured, noise current that has flowed in from the converter 25 is such that, as in embodiment 1, the direction of a noise current flowing through the first connection wire 12 and the direction of a noise current flowing through the second connection wire 15 are the same as each other. In addition, the first connection wire 12 and the wire portion 52 of the second connection wire 15 are parallel to each other.

Therefore, as in the noise filter shown in FIG. 16, the residual inductance of the line-to-line capacitor itself is reduced, whereby the attenuation characteristic for normal mode noise can be further improved.

In the noise filter shown in FIG. 17, the second connection wire 15 is composed of the wire portion formed on the surface of the printed board and the jumper wire extending across the fourth introduction wire 9. However, the first connection wire 12 may be composed of the wire portion formed on the surface of the printed board and the jumper wire extending across the second introduction wire 5.

The noise filter described in the present embodiment can be formed with the printed board having one layer. In embodiment 1, the noise filter formed with the printed board having two layers has been described, and the distance between the first connection wire 12 and the second connection wire 15 is determined by the thickness of the insulation layer of the printed board. However, the thicknesses of an insulation layer of a multilayered printed board cannot be arbitrarily determined.

The gap between the first connection wire 12 and the second connection wire 15 is preferably set to be as narrow as possible in order for a current flowing through the first capacitor 16 to be made large owing to magnetic fields generated by currents flowing through the first connection wire 12 and the second connection wire 15. In the present embodiment, the first connection wire 12 and the second connection wire 15 are, at portions thereof parallel to each other, formed on the same printed board, and thus the gap between the wires can be narrowed within such a range as to ensure insulation therebetween. As a result, it becomes easy to adjust the intensities of the magnetic fields.

Embodiment 4

Figure 18:
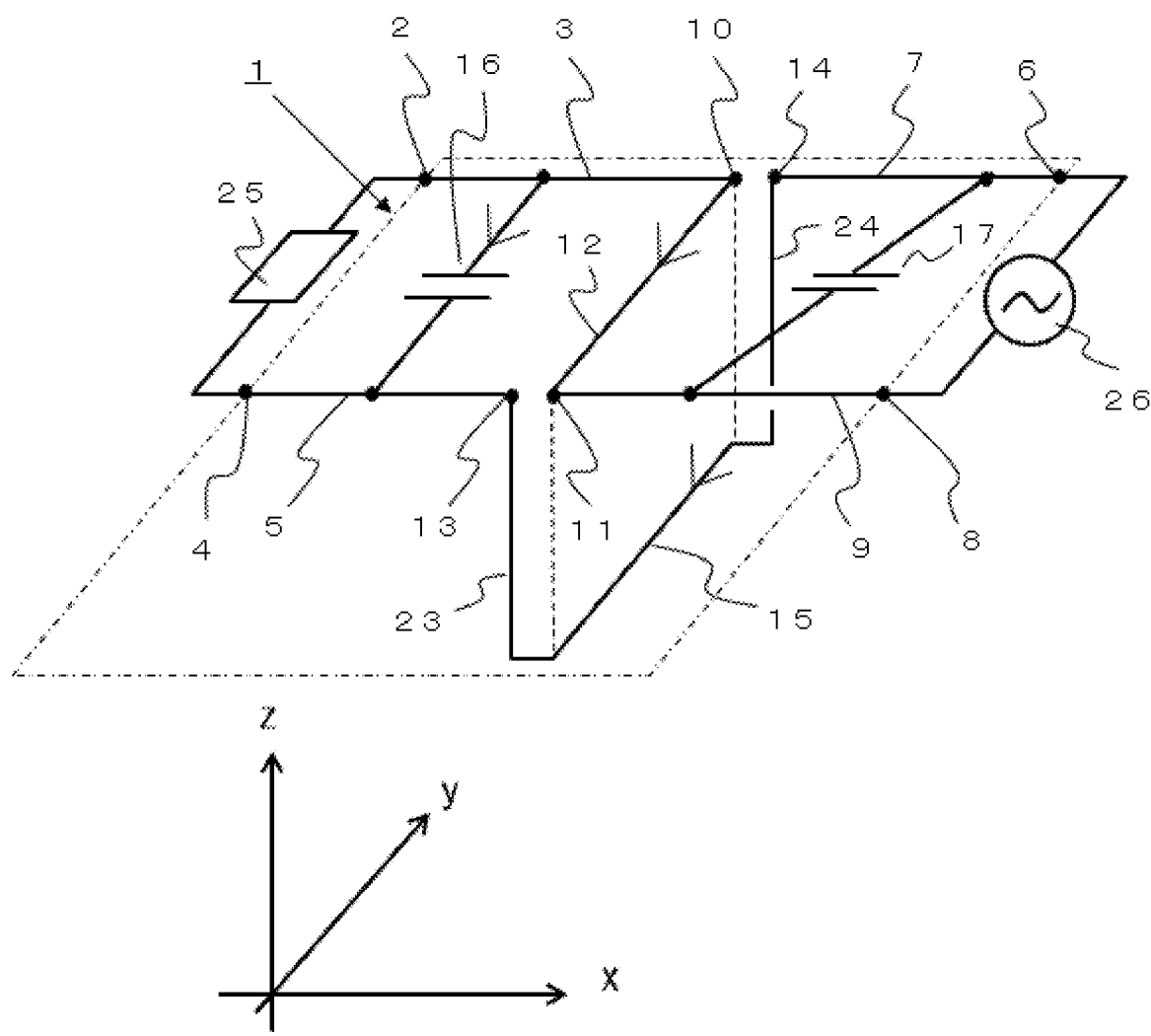
FIG. 18 is a schematic diagram of a noise filter according to embodiment 4 of the present invention.

FIG. 18 is a schematic diagram showing a circuit configuration of a noise filter according to embodiment 4 for carrying out the present invention. The configuration of the noise filter according to the present embodiment is similar to that according to embodiment 1 but different therefrom in that, while the first connection wire 12 and the second connection wire 15 are arranged parallel to each other in the y-axis direction, the noise filter according to embodiment 4 is configured such that a line segment connecting the connection point of the first capacitor 16 with the first introduction wire 3 to the connection point of the first capacitor 16 with the second introduction wire 5 is parallel to the y-axis direction so as to cause the direction of a current flowing through the first capacitor 16 to be parallel to the first connection wire 12 and the second connection wire 15.

By thus configuring the noise filter, a current flowing through the first capacitor 16 can be made larger owing to magnetic fields generated by currents flowing through the first connection wire 12 and the second connection wire 15.

Meanwhile, the direction of a current flowing through the second capacitor 17 is not preferably parallel to the first connection wire 12 and the second connection wire 15. Therefore, the present embodiment is configured such that a line segment connecting the connection point of the second capacitor 17 with the third introduction wire 7 to the connection point of the second capacitor 17 with the fourth introduction wire 9 is not parallel to the y-axis direction.

By thus configuring the noise filter, a magnetic field generated by a current flowing through the second capacitor 17 and magnetic fields generated by currents flowing through the first connection wire 12 and the second connection wire 15 are displaced from each other. Accordingly, the magnetic fields are less likely to intensify each other, whereby decrease in the current flowing through the second capacitor 17 can be suppressed.

Embodiment 5

Figure 19:
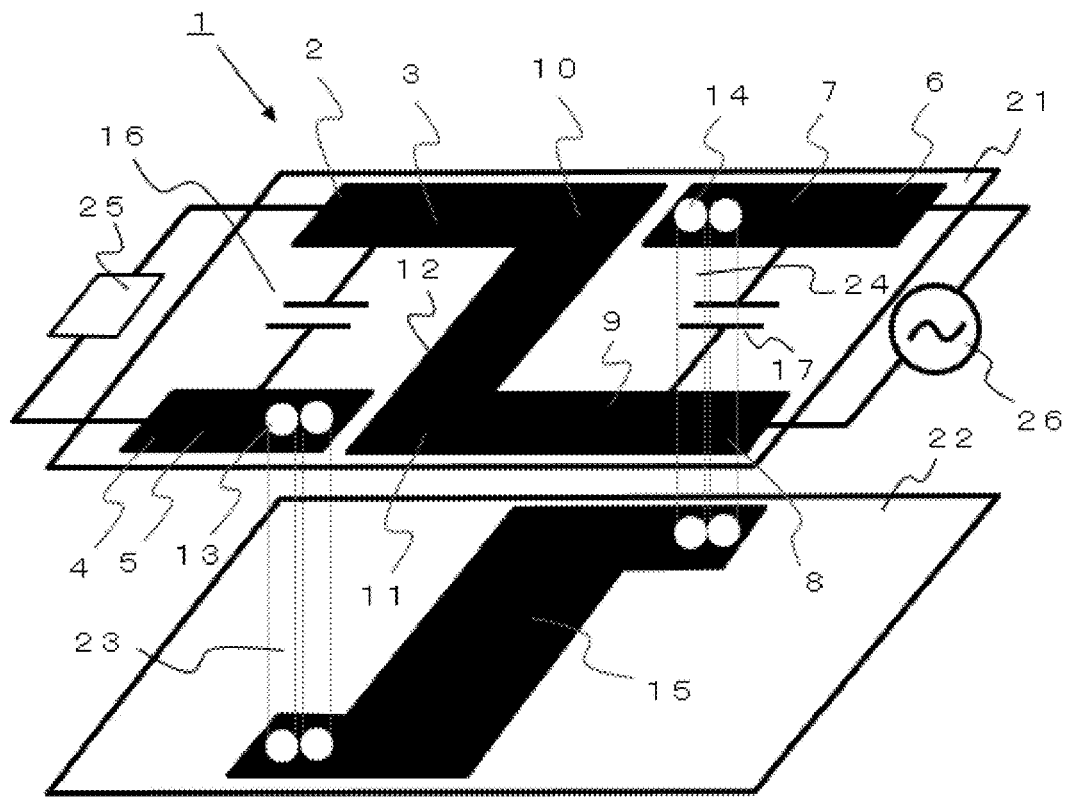
FIG. 19 is a schematic diagram of a noise filter according to embodiment 5 of the present invention.

FIG. 19 is a schematic diagram of a noise filter according to embodiment 5 for carrying out the present invention. FIG. 19 is a perspective view schematically showing a wiring pattern of the noise filter in which the printed board having two layers is used. The noise filter 1 according to the present embodiment is similar to the noise filter according to embodiment 1 but different therefrom in the thickness of a wire, and the like.

As shown in FIG. 19, in the noise filter according to the present embodiment, the width of the second connection wire 15 is set to be larger than the width of the first connection wire 12, and two through-holes 23 and two through-holes 24 are formed.

Figure 20:
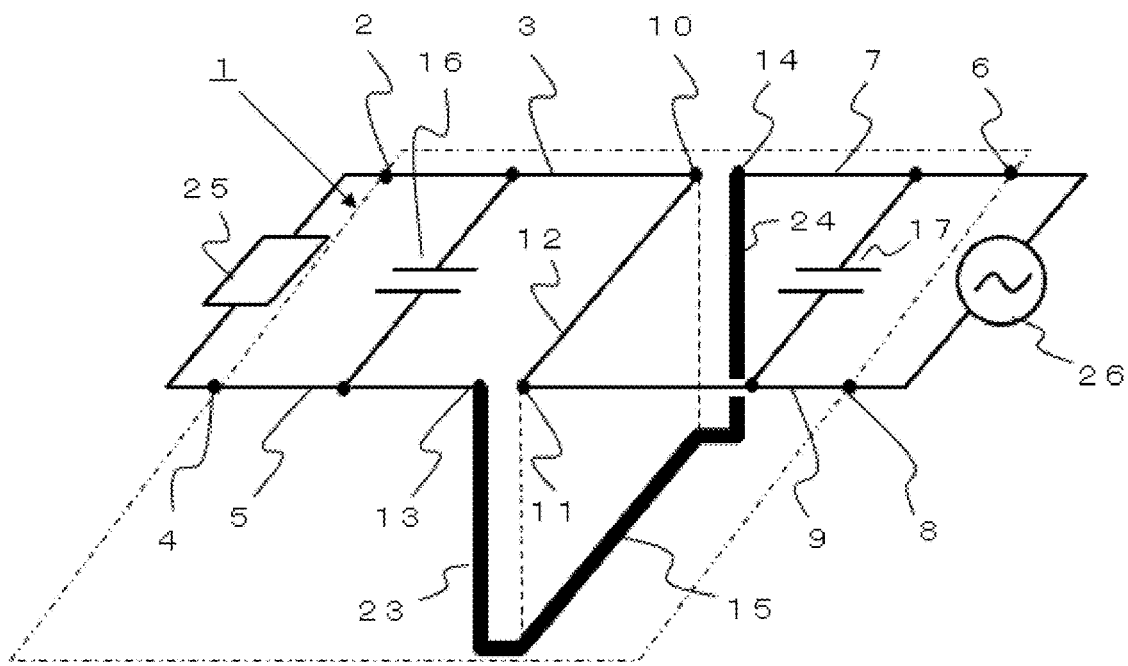
FIG. 20 is a schematic diagram of the noise filter according to embodiment 5 of the present invention.

FIG. 20 is a schematic diagram showing a circuit configuration of the noise filter 1 according to the present embodiment. FIG. 20 indicates that the width of a wire portion connecting the other end 13 of the second introduction wire 5 and the other end 14 of the third introduction wire 7 to each other is large.

The second connection wire 15 is formed so as to pass via the second layer 22 of the printed board having two layers in order to avoid contact with the first connection wire 12. Therefore, the length of the second connection wire 15 connecting the end 13 and the end 14 to each other is larger than the length of the first connection wire 12 connecting the end 10 and the end 11 to each other. The difference between the lengths of the wires corresponds to the difference between the residual inductances of the wires. Thus, if the second connection wire 15 and the first connection wire 12 have the same width, the residual inductance of the second connection wire 15 is higher than the residual inductance of the first connection wire 12. As a result, the induced electromotive force caused by a noise current flowing through the second connection wire 15 decreases.

In the present embodiment, the width of the second connection wire 15 is set to be larger than the width of the first connection wire 12, and the two through-holes 23 and the two through-holes 24 are formed, and thus the residual inductance of the second connection wire 15 can be made low. As a result, the induced electromotive force caused by a noise current flowing through the second connection wire 15 is increased, whereby the attenuation characteristic of the noise filter can be improved.

Embodiment 6

Figure 21:
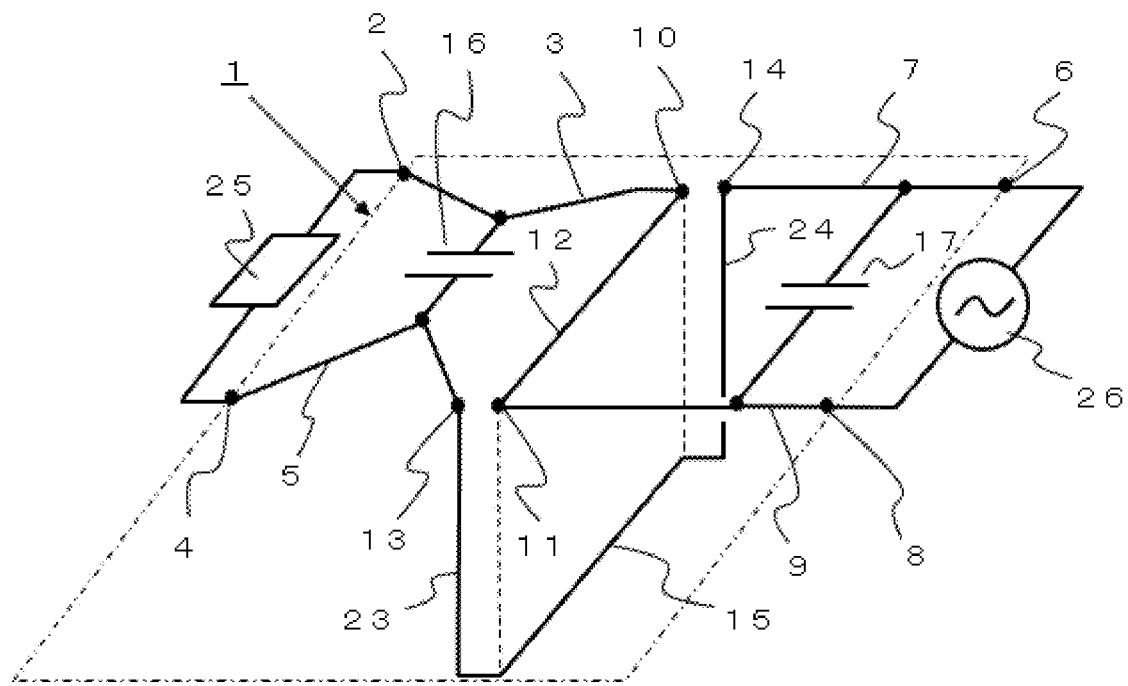
FIG. 21 is a schematic diagram of a noise filter according to embodiment 6 of the present invention.

FIG. 21 is a schematic diagram showing a circuit configuration of a noise filter according to embodiment 6 for carrying out the present invention. The noise filter 1 according to the present embodiment is similar to the noise filter according to embodiment 1. However, the length of a connection wire between the first capacitor 16 and the first introduction wire 3, and the length of a connection wire between the first capacitor 16 and the second introduction wire 5, are set to be short.

If the length between the first capacitor 16 and each of both ends is thus set to be short, the residual inductance of the first capacitor 16 can be reduced. As a result, the residual inductance of the line-to-line capacitor itself is further reduced, whereby the attenuation characteristic for normal mode noise can be further improved.

Figure 22:
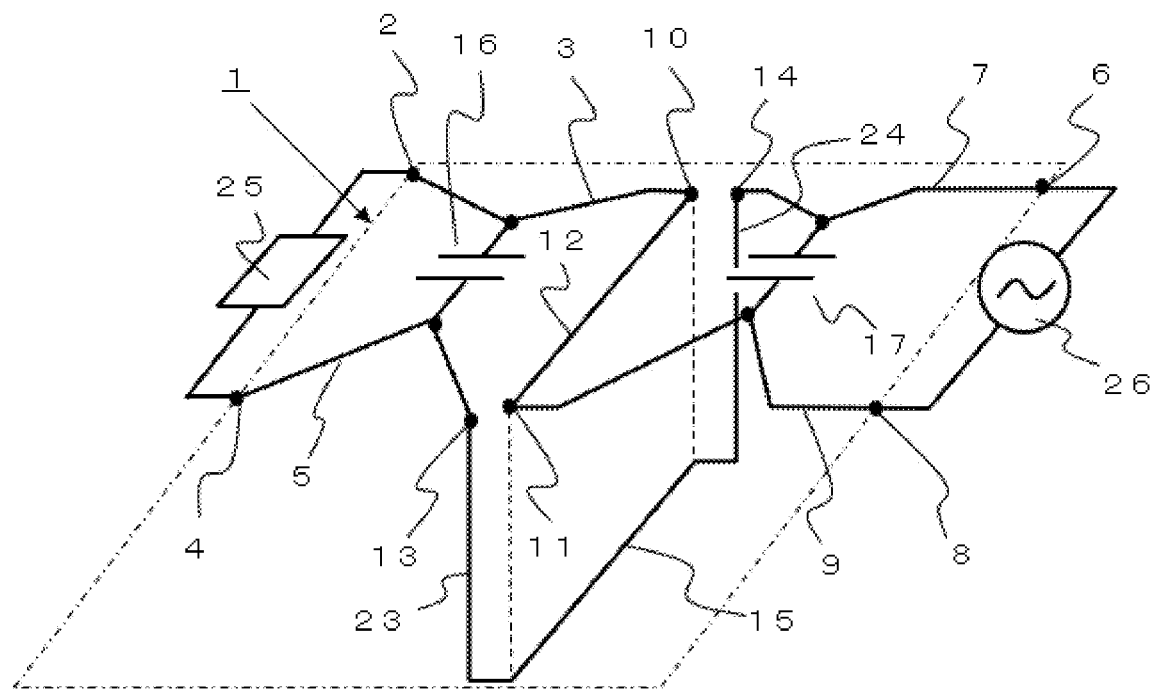
FIG. 22 is a schematic diagram of the noise filter according to embodiment 6 of the present invention.

FIG. 22 is a schematic diagram showing a circuit configuration of another noise filter according to the present embodiment. In the noise filter shown in FIG. 22, the length of a connection wire between the second capacitor 17 and the third introduction wire 7, and the length of a connection wire between the second capacitor 17 and the fourth introduction wire 9, are set to be short.

If the length between the second capacitor 17 and each of both ends is thus set to be short, the residual inductance of the second capacitor 17 can be reduced. As a result, the residual inductance of the line-to-line capacitor itself is further reduced, whereby the attenuation characteristic for normal mode noise can be further improved.

Embodiment 7

Figure 23:
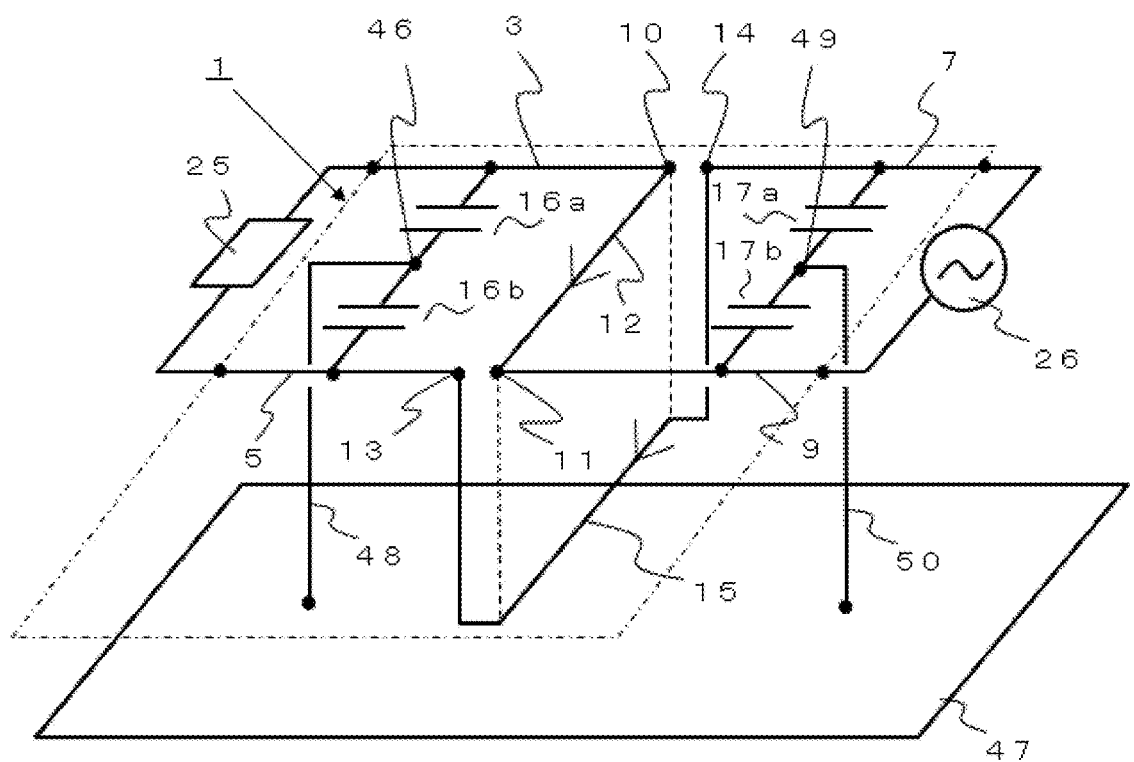
FIG. 23 is a schematic diagram of a noise filter according to embodiment 7 of the present invention.

FIG. 23 is a schematic diagram showing a circuit configuration of a noise filter according to embodiment 7 for carrying out the present invention. The noise filter 1 according to the present embodiment is similar to the noise filter according to embodiment 1 but different therefrom in the following points.

A first capacitor is composed of two capacitors 16a and 16b connected in series, and a connection point 46 between the two capacitors is connected through a grounding wire 48 to a ground 47 at a ground potential. Further, a second capacitor is composed of two capacitors 17a and 17b connected in series, and a connection point 49 between the two capacitors is connected through a grounding wire 50 to the ground 47 at the ground potential. Here, it is preferable that: the ground 47 is a metal housing of a device mounted with the noise filter according to the present embodiment; and the ground of the metal housing is at the same potential inside the housing. Further, it is preferable that the metal housing is at the same potential as an earth potential.

In the noise filter which is thus configured, the attenuation characteristic for normal mode noise can be further improved by the same advantageous effects as those in embodiment 1. Further, since the noise filter is connected to the ground through the grounding wires, common mode noise that propagates to the ground side through a signal line can also be reduced.

The two capacitors 16a and 16b, and the two capacitor 17a and capacitor 17b, can also be regarded as capacitors to ground for reducing common mode noise. Description will be made with the first introduction end 2 serving as a positive electrode and with the second introduction end 4 serving as a negative electrode. As described in embodiment 1, currents easily flow through the capacitor 16a and the capacitor 17a owing to magnetic fields generated by the first connection wire 12 and the second connection wire 15. However, since the connection points 46 and 49 of the two capacitors are connected to the ground 47, the currents are less likely to flow through the capacitor 16b and the capacitor 17b. A current having flowed in from the positive electrode passes through the capacitor 16a and the capacitor 17b to flow to the ground, and a current having flowed out to the negative electrode passes through the capacitor 16b and the capacitor 17a to flow to the ground. At this time, in the noise filter according to the present embodiment, owing to induced electromotive force, currents are more likely to flow through the capacitor 16a and the capacitor 17a, and in contrast, currents are less likely to flow through the capacitor 16b and the capacitor 17b. Therefore, the current having flowed in from the positive electrode passes through the capacitor 16a causing current to be more likely to flow therethrough and the capacitor 17b causing current to be less likely to flow therethrough, and the current having flowed out to the negative electrode passes through the capacitor 16b causing current to be less likely to flow therethrough and the capacitor 17a causing current to be more likely to flow therethrough. Accordingly, the value of the current flowing from the first introduction wire 3 to the fourth introduction wire 9, and the value of the current flowing from the second introduction wire 5 to the third introduction wire 7, become substantially equal to each other, thereby improving symmetry. Thus, noise that is converted from normal mode noise to common mode noise can be reduced.

In the present embodiment, each of the first capacitor and the second capacitor is composed of two capacitors to ground, and it cannot be recommended that only one of the first capacitor and the second capacitor is composed of the capacitors to ground. The reason is as follows. That is, it becomes easy for current to flow through the capacitor 16a, and further, it becomes easy for current to flow also through the capacitor 16b. This causes deterioration in symmetry between a current having flowed in from the positive electrode and a current having flowed out to the negative electrode. Accordingly, noise that is converted from normal mode noise into common mode noise increases.

Although each of the first capacitor and the second capacitor is composed of the two capacitors to ground in the present embodiment, each of the first capacitor and the second capacitor may be composed of, instead of two capacitors to ground, a three-terminal capacitor having a low residual inductance or a vertical/horizontal inversion type laminated ceramic capacitor having a low residual inductance.

Embodiment 8

Figure 24:
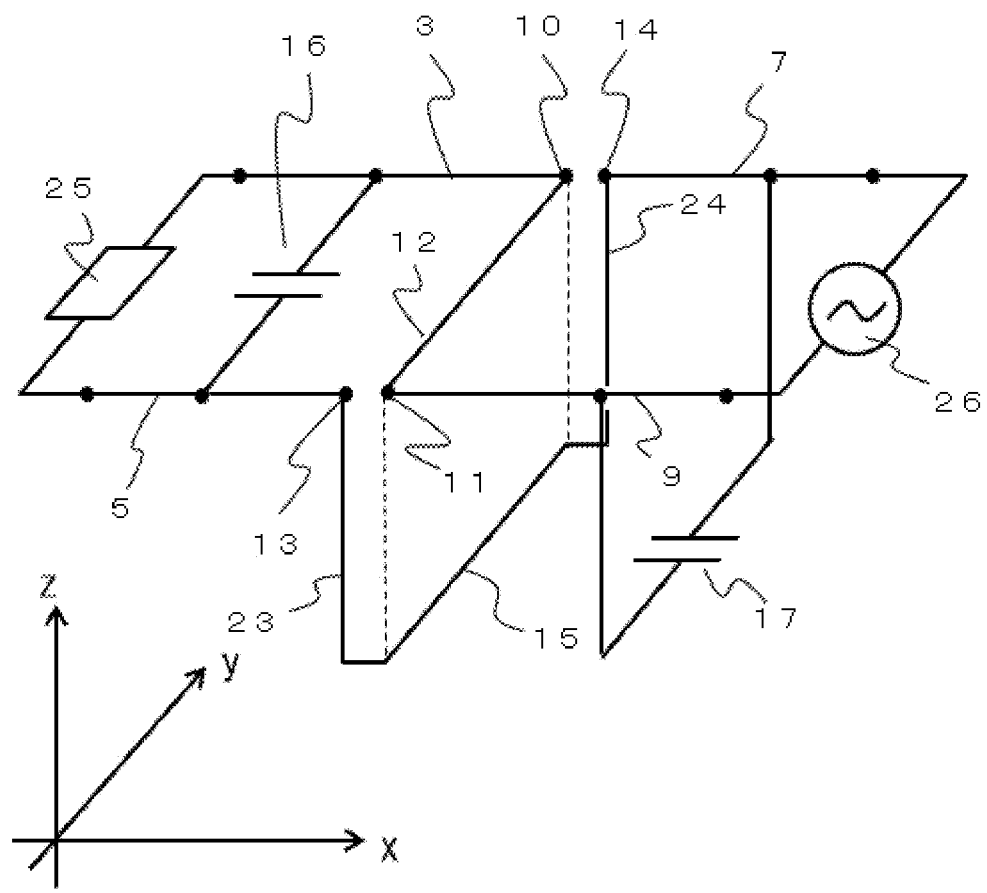
FIG. 24 is a schematic diagram of a noise filter according to embodiment 8 of the present invention.

FIG. 24 is a schematic diagram showing a circuit configuration of a noise filter according to embodiment 8 for carrying out the present invention. The noise filter 1 according to the present embodiment is similar to the noise filter according to embodiment 1 but different therefrom in the following points.

In the noise filter according to embodiment 1, the second capacitor 17 is disposed on the first layer of the printed board having two layers. Meanwhile, in the present embodiment, the second capacitor 17 is disposed at a position displaced from the first capacitor in the z-axis direction. The present embodiment can be realized by, for example, disposing the second capacitor 17 on the second layer in the noise filter described in embodiment 1.

In the noise filter which is thus configured, the attenuation characteristic for normal mode noise can be further improved by the same advantageous effects as those in embodiment 1.

In addition, since the distance between the first capacitor 16 and the second capacitor 17 is increased, magnetic coupling between the capacitors is suppressed, and the attenuation characteristic for normal mode noise is enhanced. Regarding capacitors having large dimensions such as film capacitors, a great potential difference is generated between surfaces opposed by the two capacitors in the case where wires intersect with each other, as compared with the case where the wires do not intersect with each other. As a result, electrical coupling occurs between the two capacitors, and the path of the electrical coupling does not extend via the first connection wire 12 and the second connection wire 15, whereby the attenuation characteristic for normal mode noise deteriorates. However, in the configuration of the present embodiment, such electrical coupling does not occur so that the attenuation characteristic for normal mode is enhanced, although the extent of amelioration of the electrical coupling is much smaller than that of magnetic coupling.

In the present embodiment, a configuration has been described in which, with use of the printed board having two layers, the first capacitor 16 is disposed on the first layer and the second capacitor 17 is disposed on the second layer. However, the positional relationship may be opposite thereto.

Figure 25:
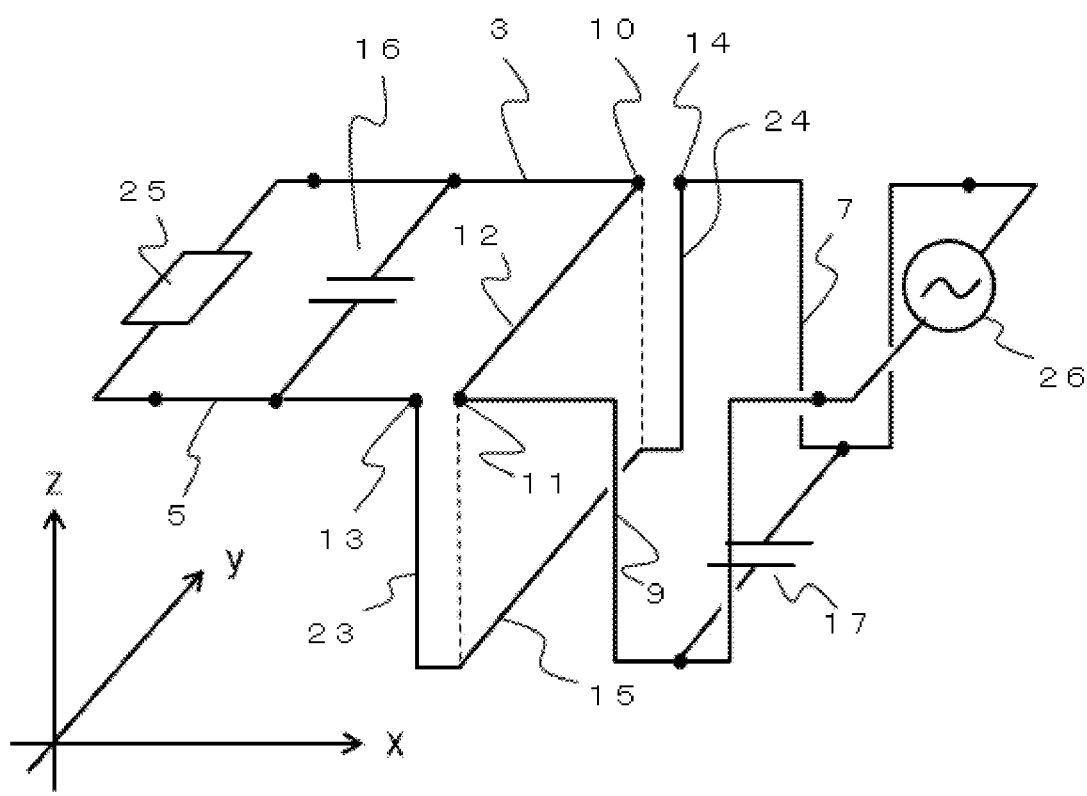
FIG. 25 is a schematic diagram of the noise filter according to embodiment 8 of the present invention.

FIG. 25 is a schematic diagram showing a circuit configuration of another noise filter according to the present embodiment. As shown in FIG. 25, portions of the third introduction wire 7 and the fourth introduction wire 9 may be extended to positions displaced in the z-axis direction.

Embodiment 9

Figure 26:
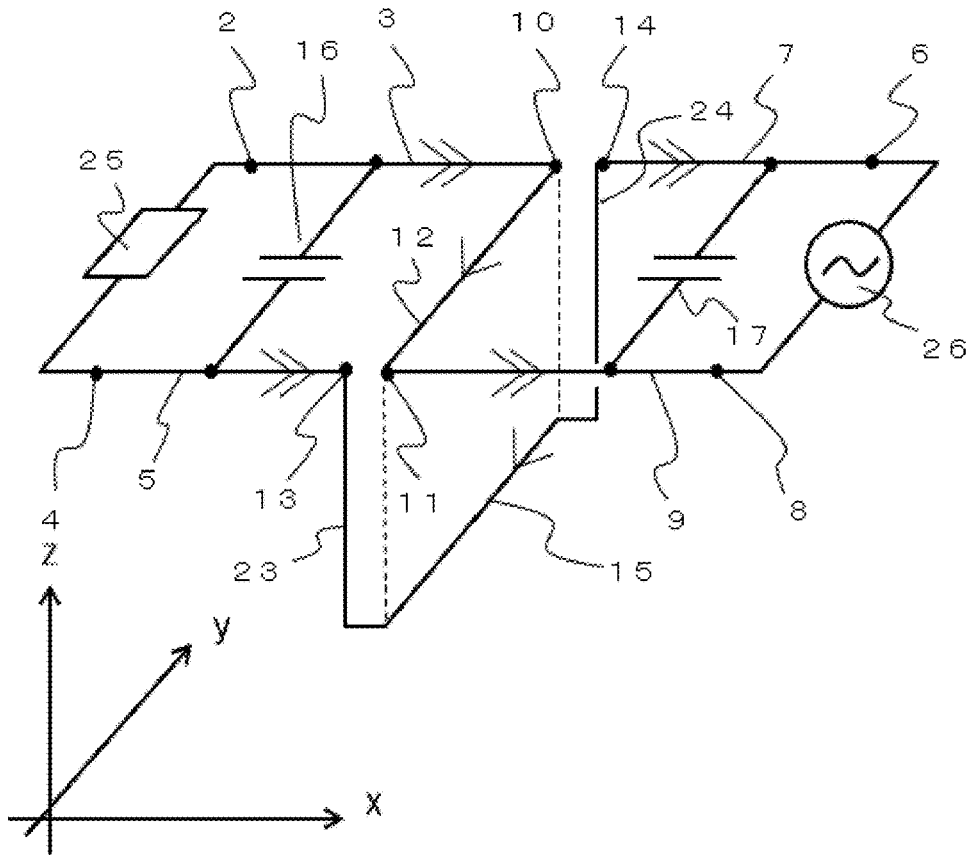
FIG. 26 is a schematic diagram of a noise filter according to embodiment 9 of the present invention.

FIG. 26 is a schematic diagram showing a circuit configuration of a noise filter according to embodiment 9 for carrying out the present invention. The noise filter 1 according to the present embodiment is similar to the noise filter according to embodiment 1 but different therefrom in the following points.

In the noise filter according to embodiment 1, the first connection wire 12 and the second connection wire 15 are arranged parallel to each other. In the noise filter according to the present embodiment, in addition thereto, the first introduction wire 3 and the second introduction wire 5 are arranged parallel to each other, and the third introduction wire 7 and the fourth introduction wire 9 are also arranged parallel to each other.

By thus configuring the noise filter, the direction of a current flowing from the first introduction wire 3 to the fourth introduction wire 9 and the direction of a current flowing from the third introduction wire 7 to the second introduction wire 5, are symmetric about a yz plane, whereby a noise component that is generated by asymmetry and that is converted from normal mode noise to common mode noise, can be made small.

Figure 27:
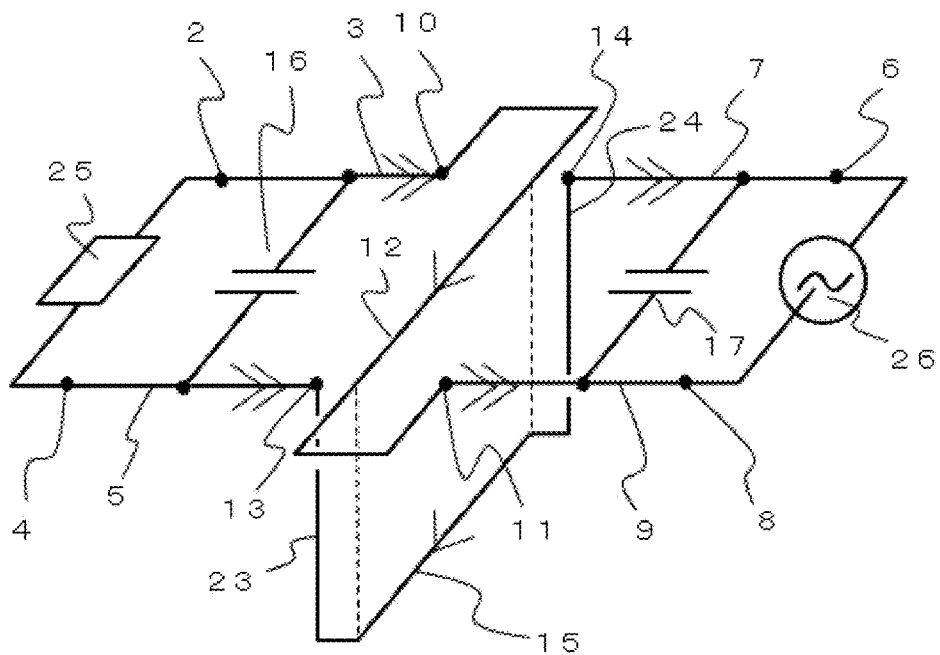
FIG. 27 is a schematic diagram of the noise filter according to embodiment 9 of the present invention.

FIG. 27 is a schematic diagram showing a circuit configuration of another noise filter according to the present embodiment. The noise filter shown in FIG. 27 is obtained by modifying the configuration of the noise filter shown in FIG. 26 so as to extend both ends of the first connection wire 12 in the y-axis direction such that the length of the first connection wire 12 becomes equal to the length of the second connection wire 15.

By thus configuring the noise filter, the residual inductance of the first connection wire 12 and the residual inductance of the second connection wire 15 become equal to each other. Thus, a noise component that is generated by asymmetry and that is converted from normal mode noise to common mode noise can be made further smaller.

Embodiment 10

Figure 28:
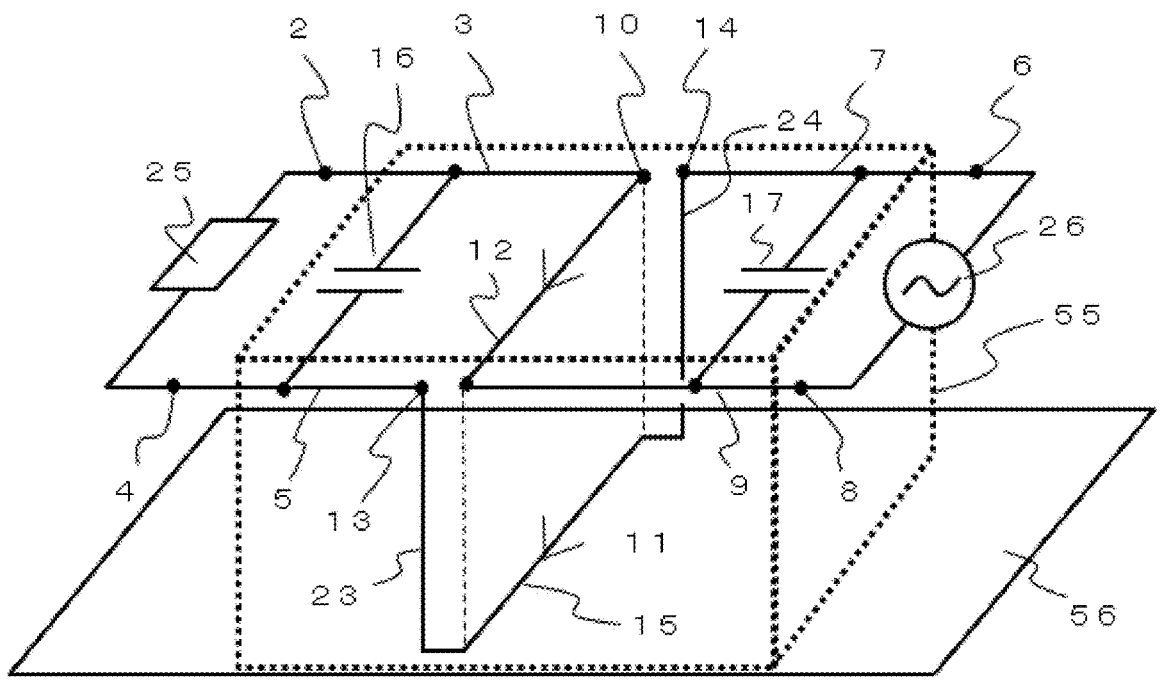
FIG. 28 is a schematic diagram of a noise filter according to embodiment 10 of the present invention.

FIG. 28 is a schematic diagram showing a circuit configuration of a noise filter according to embodiment 10 for carrying out the present invention. The noise filter 1 according to the present embodiment is similar to the noise filter according to embodiment 1 but different therefrom in the following points.

An electromagnetic shield 55 enclosing the first capacitor 16, the second capacitor 17, the first connection wire 12, and the second connection wire 15 is provided, and the electromagnetic shield 55 is connected to a ground 56. The ground 56 may be a metal housing of the device mounted with the noise filter according to the present embodiment, or may be a ground directly connected to the earth.

The noise filter which is thus configured enables external magnetic field to be prevented from entering the imaginary loop that is formed by the first capacitor 16, the second introduction wire 5, the first connection wire 12, the second connection wire 15, and the first introduction wire 3. Accordingly, induced electromotive force can be assuredly generated in the imaginary loop. As a result, the residual inductance of the line-to-line capacitor itself is reduced, whereby the attenuation characteristic for normal mode noise can be further assuredly improved.

Embodiment 11

Figure 29:
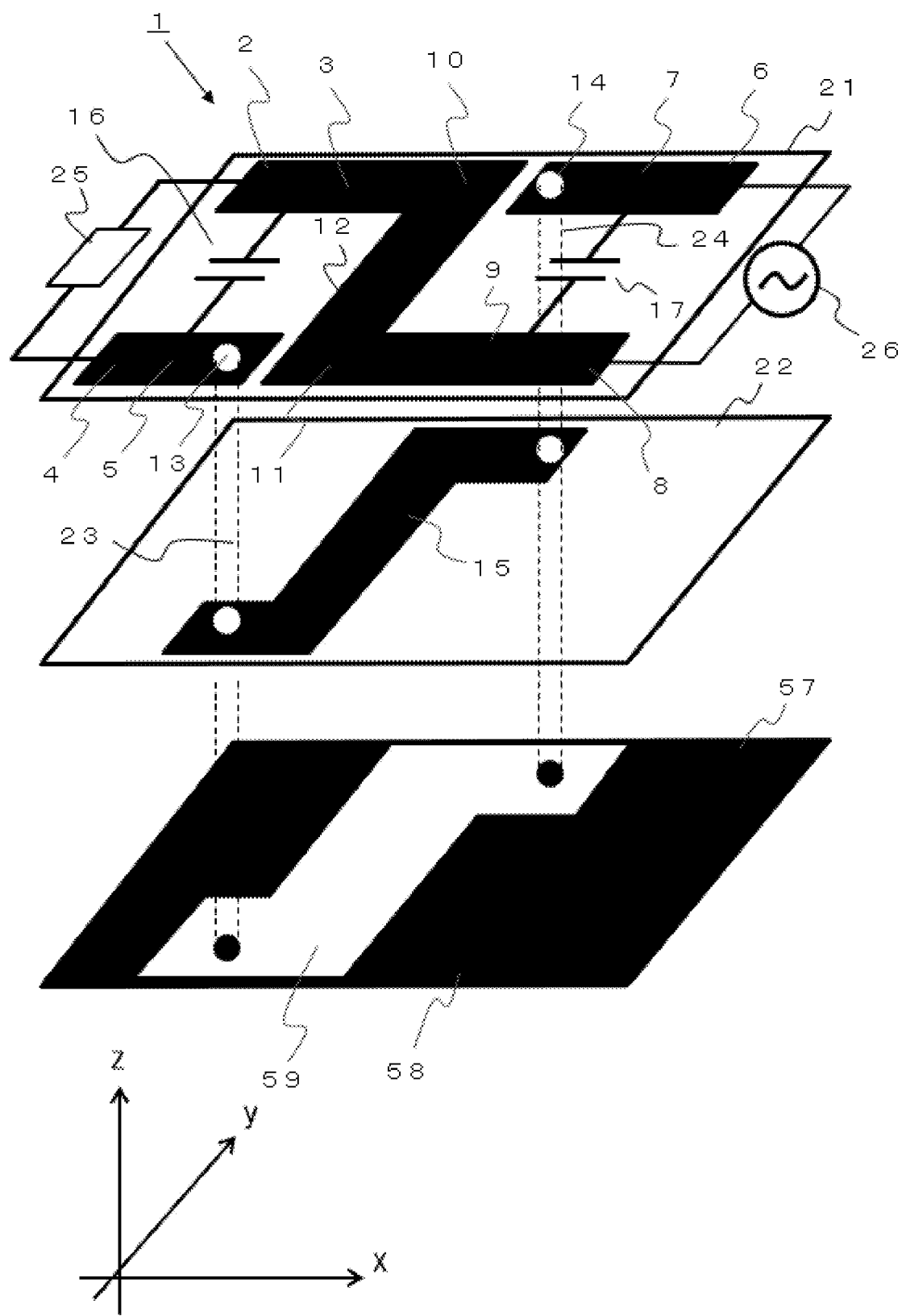
FIG. 29 is a schematic diagram of a noise filter according to embodiment 11 of the present invention.

FIG. 29 is a schematic diagram showing a circuit configuration of a noise filter according to embodiment 11 for carrying out the present invention. The noise filter 1 according to the present embodiment is similar to the noise filter according to embodiment 1 but different therefrom in the following points.

In the present embodiment, the noise filter 1 is composed of a printed board having three layers, and a third layer 57 includes a conductor layer 58 and a clearance region 59 in which no conductor layer is formed. The clearance region 59 is located so as to oppose the second connection wire 15 formed on the second layer 22, and is formed so as to be larger than the region of the second connection wire 15.

If the conductor layer 58 of the third layer 57 is formed in the entire region of the third layer 57, the conductor layer 58 hinders a magnetic field loop generated by currents flowing through the first connection wire and the second connection wire. As a result, induced electromotive force generated in the imaginary loop that is formed by the first capacitor 16, the second introduction wire 5, the first connection wire 12, the second connection wire 15, and the first introduction wire 3 is weakened.

In the case where the noise filter is composed of a printed board having three layers as in the present embodiment, induced electromotive force can be efficiently generated in the imaginary loop by providing, to the third layer, a clearance layer having a region that is larger than the region of the second connection wire 15. The same configuration in which the clearance layer is provided applies also to the case where a printed board having four or more layers is used.

Embodiment 12

Figure 30:
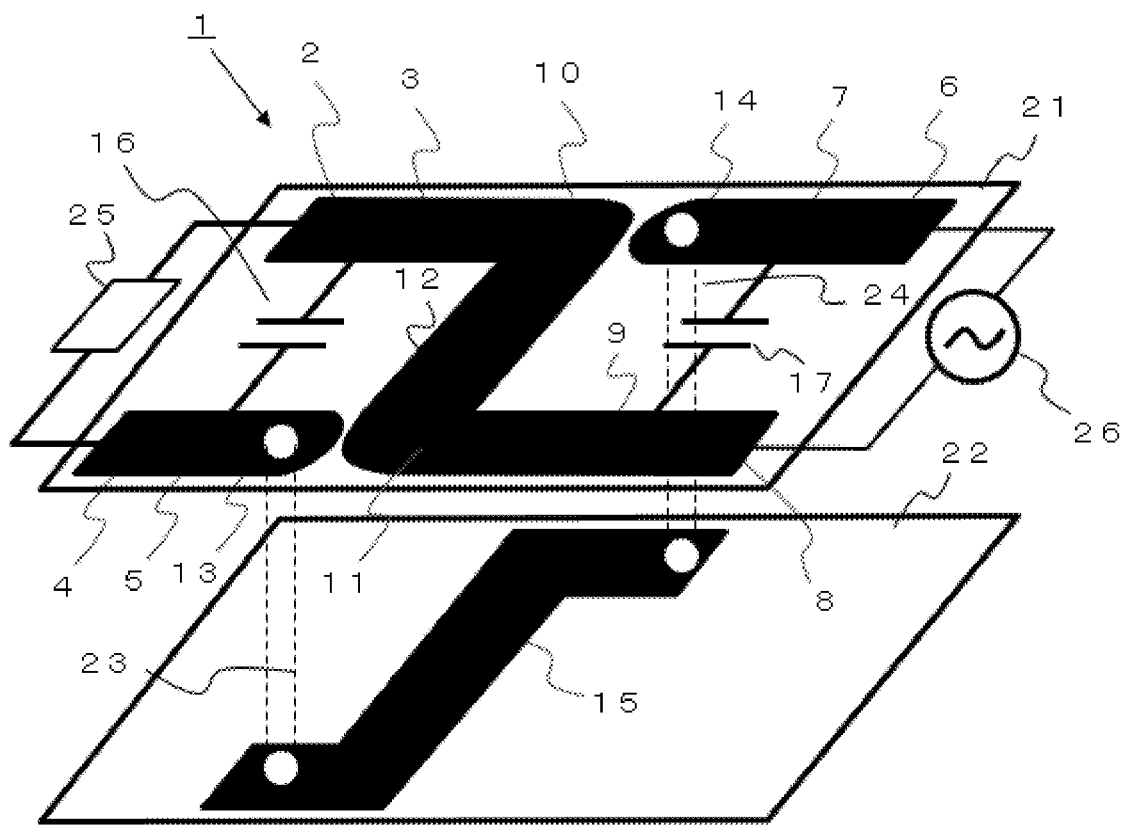
FIG. 30 is a schematic diagram of a noise filter according to embodiment 12 of the present invention.

FIG. 30 is a schematic diagram showing a circuit configuration of a noise filter according to embodiment 12 for carrying out the present invention. The noise filter 1 according to the present embodiment is similar to the noise filter according to embodiment 1 but different therefrom in the following points.

As shown in FIG. 30, in the noise filter according to the present embodiment, the other end 10 of the first introduction wire 3 and the other end 14 of the third introduction wire 7 which are disposed so as to oppose each other are rounded, and further, the other end 13 of the second introduction wire 5 and the other end 11 of the fourth introduction wire 9 which are disposed so as to oppose each other are also rounded.

In the noise filter according to the present embodiment, the first connection wire 12 and the second connection wire 15 are arranged parallel to each other. Therefore, the distance between the end 10 and the end 14 and the distance between the end 13 and the end 11 are shorter than in a conventional noise filter (shown in FIG. 8) having a configuration in which the first connection wire and the second connection wire cross. In addition, high voltages inputted from the third introduction end 6 and the fourth introduction end 8 for the AC power supply 26 are applied between the first introduction wire 3 and the third introduction wire 7 and between the first introduction wire 3 and the second introduction wire 5. Potential differences are generated between the wires, and thus, if the distance between the ends of the wires becomes shorter than in the conventional case, electric discharge, dielectric breakdown, or the like may occur.

In many cases, electric discharge originates from sharp corners. Thus, if the ends of the wires prone to be subjected to potential differences therebetween are rounded as in the present embodiment, it is possible to prevent occurrence of electric discharge, dielectric breakdown, and the like.

Alternatively, the distance between the ends of the wires prone to be subjected to potential differences therebetween may be elongated instead of rounding the ends of the wires prone to be subjected to potential differences therebetween.

DESCRIPTION OF THE REFERENCE CHARACTERS 1 noise filter
2 first introduction end
3 first introduction wire
4 second introduction end
5 second introduction wire
6 third introduction end
7 third introduction wire
8 fourth introduction end
9 fourth introduction wire
10, 11, 13, 14 end
12 first connection wire
15 second connection wire
16 first capacitor
17 second capacitor
21 first layer
22 second layer
23, 24 through-hole
25 converter
26 AC power supply
41 commercial power supply (AC power supply)
42 outdoor unit
43 converter circuit
44 motor
45 inverter circuit
48, 50 grounding wire
51 printed board
52 wire portion
53 jumper wire
55 electromagnetic shield
47, 56 ground
57 third layer
58 conductor layer
59 clearance region

The invention claimed is:
1. A noise filter comprising:
a first introduction wire having one end that serves as a first introduction end;
a second introduction wire having one end that serves as a second introduction end;
a third introduction wire having one end that serves as a third introduction end;
a fourth introduction wire having one end that serves as a fourth introduction end;
a first connection wire connecting another end of the first introduction wire and another end of the fourth introduction wire to each other and configured to conduct a current from the first introduction wire to the fourth introduction wire;
a second connection wire connecting another end of the second introduction wire and another end of the third introduction wire to each other and configured to conduct a current from the second introduction wire to the third introduction wire;
a first capacitor connected between the first introduction wire and the second introduction wire; and
a second capacitor connected between the third introduction wire and the fourth introduction wire, wherein
each of the first connection wire and the second connection wire includes a linear main portion, the main portion of the first connection wire and the main portion of the second connection wire are parallel to each other, and a direction that connects terminals of the first capacitor to each other is the same as a direction of the main portion.

2. The noise filter according to claim 1, wherein the first introduction wire and the first connection wire are arranged entirely on a same layer of the printed board.

3. The noise filter according to claim 1, wherein the first introduction wire and the third introduction wire are arranged entirely on a same layer of the printed board.

4. The noise filter according to claim 1, wherein the second introduction wire and the third introduction wire are arranged entirely on a same layer of the printed board.

5. The noise filter according to claim 1, wherein a width of the second connection wire is equal to or larger than a width of the first connection wire.

6. The noise filter according to claim 1, wherein
each of the first capacitor and the second capacitor is composed of two capacitors connected in series, and
a middle point between the two capacitors is connected to an earth.

7. The noise filter according to claim 1, further comprising an electromagnetic shield enclosing the first capacitor, the second capacitor, the first connection wire, and the second connection wire.

8. A noise filter comprising:
a first introduction wire having one end that serves as a first introduction end;
a second introduction wire having one end that serves as a second introduction end;
a third introduction wire having one end that serves as a third introduction end;
a fourth introduction wire having one end that serves as a fourth introduction end;
a first connection wire connecting another end of the first introduction wire and another end of the fourth introduction wire to each other;
a second connection wire connecting another end of the second introduction wire and another end of the third introduction wire to each other;
a first capacitor connected between the first introduction wire and the second introduction wire; and
a second capacitor connected between the third introduction wire and the fourth introduction wire,
the first connection wire and the second connection wire being partially parallel to each other in a same direction as a direction of a current flowing through the first capacitor, wherein
in a printed board having a two-layer structure including a first layer and a second layer with an insulation layer interposed therebetween,
the first introduction wire, the second introduction wire, the third introduction wire, the fourth introduction wire, the first capacitor, the second capacitor, and the first connection wire are disposed on the first layer,
the second connection wire is disposed on the second layer, and
the second connection wire, and each of the other end of the second introduction wire and the other end of the third introduction wire, are connected to each other via a corresponding through-hole formed in the insulation layer.

9. The noise filter according to claim 7, wherein
each of the first capacitor and the second capacitor is composed of two capacitors connected in series, and
a middle point between the two capacitors is connected to an earth.

10. The noise filter according to claim 8, further comprising an electromagnetic shield enclosing the first capacitor, the second capacitor, the first connection wire, and the second connection wire.

11. The noise filter according to claim 8, wherein a width of the second connection wire is equal to or larger than a width of the first connection wire.

12. A noise filter comprising:
a first introduction wire having one end that serves as a first introduction end;
a second introduction wire having one end that serves as a second introduction end;
a third introduction wire having one end that serves as a third introduction end;
a fourth introduction wire having one end that serves as a fourth introduction end;
a first connection wire connecting another end of the first introduction wire and another end of the fourth introduction wire to each other;
a second connection wire connecting another end of the second introduction wire and another end of the third introduction wire to each other;
a first capacitor connected between the first introduction wire and the second introduction wire; and
a second capacitor connected between the third introduction wire and the fourth introduction wire,
the first connection wire and the second connection wire being partially parallel to each other in a same direction as a direction of a current flowing through the first capacitor, wherein
in a printed board having a one-layer structure,
at least one of the first connection wire and the second connection wire includes a jumper wire extending across a wire portion formed on a surface of the printed board.

13. The noise filter according to claim 12, further comprising an electromagnetic shield enclosing the first capacitor, the second capacitor, the first connection wire, and the second connection wire.

14. The noise filter according to claim 12, wherein a width of the second connection wire is equal to or larger than a width of the first connection wire.

15. The noise filter according to claim 12, wherein
each of the first capacitor and the second capacitor is composed of two capacitors connected in series, and
a middle point between the two capacitors is connected to an earth.

* * * * *